(12) United States Patent
Natarajan et al.

(10) Patent No.: US 9,484,332 B2
(45) Date of Patent: Nov. 1, 2016

(54) MICRO SOLAR CELL POWERED MICRO LED DISPLAY

(71) Applicant: Intel Corporation, Santa Clara, CA (US)

(72) Inventors: Kumaran Natarajan, Bangalore (IN); Prakash K. Radhakrishnan, Portland, OR (US); Peter L. Chang, Portland, OR (US); Kunjal Parikh, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/661,135

(22) Filed: Mar. 18, 2015

(65) Prior Publication Data
US 2016/0276326 A1 Sep. 22, 2016

(51) Int. Cl.
*H01L 29/861* (2006.01)
*H01L 25/16* (2006.01)
*G09G 3/32* (2016.01)
*H01L 31/12* (2006.01)
*H01L 31/0475* (2014.01)
*H01L 31/18* (2006.01)

(52) U.S. Cl.
CPC ............... *H01L 25/167* (2013.01); *G09G 3/32* (2013.01); *H01L 31/0475* (2014.12); *H01L 31/12* (2013.01); *H01L 31/18* (2013.01); *G09G 2330/02* (2013.01); *G09G 2360/142* (2013.01)

(58) Field of Classification Search
CPC ..................... H01L 29/861; H01L 31/022425; H01L 31/12; H01L 31/18; H01L 31/4475
See application file for complete search history.

(56) References Cited

U.S. PATENT DOCUMENTS

| | | | | |
|---|---|---|---|---|
| 3,912,539 A | * | 10/1975 | Magee | H01L 27/142 136/244 |
| 6,410,940 B1 | | 6/2002 | Jiang et al. | |
| 2002/0070416 A1 | * | 6/2002 | Morse | H01L 27/1463 257/443 |
| 2010/0055824 A1 | * | 3/2010 | Lin | B82Y 10/00 438/73 |
| 2012/0291835 A1 | * | 11/2012 | Lu | H01L 27/1421 136/244 |
| 2014/0084482 A1 | * | 3/2014 | Hu | H01L 24/06 257/774 |
| 2014/0355168 A1 | * | 12/2014 | Bibl | H01L 21/76877 361/234 |
| 2015/0244315 A1 | * | 8/2015 | McNamara | H02S 50/10 136/244 |

OTHER PUBLICATIONS

PCT patent application No. PCT/US14/61053 entitled, "Micro Pick and Bond Assembly," filed on Oct. 17, 2014 (40 pages) with drawings (18 pages).
Indian patent application entitled "Distributed Memory Panel," filed Dec. 23, 2014 (44 pages).
MIT Technology Review article entitled "Micro Solar Cells Handle More Intense Sunlight" retrieved from Internet on Feb. 13, 2015 (7 pages).

* cited by examiner

*Primary Examiner* — Phuc Dang
(74) *Attorney, Agent, or Firm* — Trop Pruner & Hu, P.C.

(57) ABSTRACT

Micro LEDs may be placed on a substrate in regularly spaced rows with an empty row between at least two successive rows of micro LED. A micro solar cell may then be placed in the empty row.

19 Claims, 20 Drawing Sheets

MICRO SOLAR CELL POWERED MICRO LED DISPLAY

BACKGROUND

Conventional light emitting diodes (LEDs) are typically of a size on the order of hundreds of microns. In contrast, microsized LEDs or micro LEDs have a size on the order of tens of microns or less. They may be made up of micron sized digital components formed on appropriate substrates, separated from those substrates, and then placed together on one new substrate.

New manufacturing technologies, like micro pick and bond (MPB), facilitate both the mass transfer of these micron sized individual non-similar components that may be obtained from different substrates and also the installation of these components onto a final substrate that may be glass or flex, as examples.

In some examples, digital data stored in a memory element may be used to drive a digital-to-analog converter or a pulse width modulator or a pulse density modulator that may, in turn, drive a light emitter, such as an organic light emitting diode or an inorganic light emitting diode.

In some cases, data may be digitally driven from a driver integrated circuit of the panel electronics units and the data may be stored in a memory element using serial or parallel methods.

A common substrate may be used for multiple pixels, light emitters, and even rows of pixels. This may allow for a reduction in the number of memory integrated circuits.

BRIEF DESCRIPTION OF THE DRAWINGS

Some embodiments are described with respect to the following figures.

DETAILED DESCRIPTION

Figure 1:
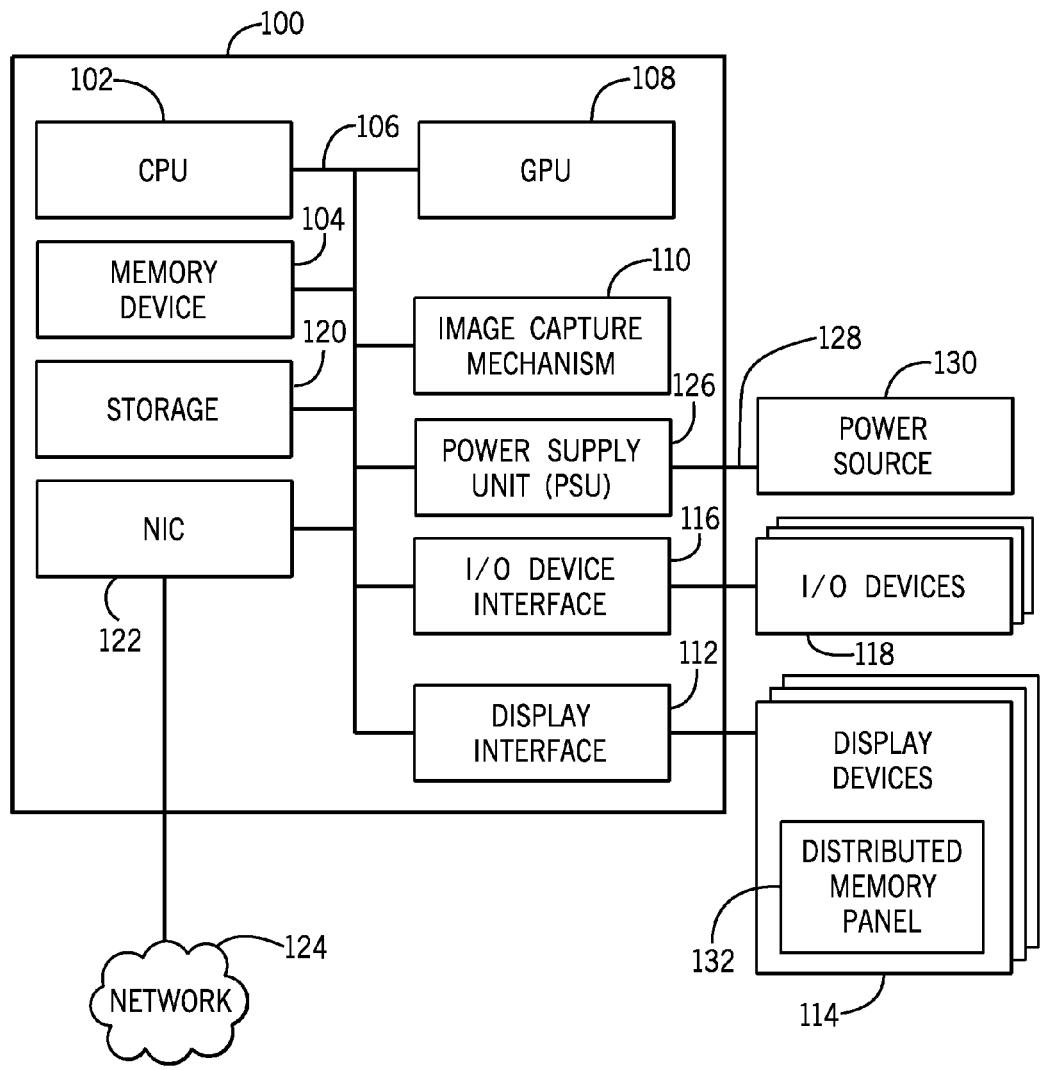
FIG. 1 is a schematic depiction of one embodiment.

FIG. 1 is a diagram illustrating an example of a computing device 100 to implement the distributed memory panel techniques discussed herein. The computing device 100 may be, for example, a laptop computer, desktop computer, ultrabook, tablet computer, mobile device, or server, among others. The computing device 100 may include a central processing unit (CPU) 102 that is configured to execute stored instructions, as well as a memory device 104 that stores instructions that are executable by the CPU 102. The CPU may be coupled to the memory device 104 by a bus 106. Additionally, the CPU 102 can be a single core processor, a multi-core processor, a computing cluster, or any number of other configurations. Furthermore, the computing device 100 may include more than one CPU 102.

The computing device 100 may also include a graphics processing unit (GPU) 108. As shown, the CPU 102 may be coupled through the bus 106 to the GPU 108. The GPU 108 may be configured to perform any number of graphics functions and actions within the computing device 100. For example, the GPU 108 may be configured to render or manipulate graphics images, graphics frames, videos, or the like, to be displayed to a user of the computing device 100.

The memory device 104 can include random access memory (RAM), read only memory (ROM), flash memory, or any other suitable memory systems. For example, the memory device 104 may include dynamic random access memory (DRAM). The computing device 100 includes an image capture mechanism 110. In some examples, the image capture mechanism 110 is a camera, stereoscopic camera, scanner, infrared sensor, or the like.

The CPU 102 may be linked through the bus 106 to a display interface 112 configured to connect the computing device 100 to one or more display devices 114. The display device(s) 114 may include a display screen that is a built-in component of the computing device 100. Examples of such a computing device include mobile computing devices, such as cell phones, tablets, 2-in-1 computers, notebook computers or the like. The display devices 114 may also include a computer monitor, television, or projector, among others, that is externally connected to the computing device 100. In some cases, the display devices 114 may be head-mounted display devices having a display capacity via projection, digital display, filtering incoming light, and the like.

The CPU 102 may also be connected through the bus 106 to an input/output (I/O) device interface 116 configured to connect the computing device 100 to one or more I/O devices 118. The I/O devices 118 may include, for example, a keyboard and a pointing device, wherein the pointing device may include a touchpad or a touchscreen, among others. The I/O devices 118 may be built-in components of the computing device 100, or may be devices that are externally connected to the computing device 100. In some cases, the I/O devices 118 are touchscreen devices integrated within a display device, such as one or more of the display devices 114.

The computing device 100 may also include a storage device 120. The storage device 120 is a physical memory such as a hard drive, an optical drive, a thumbdrive, an array of drives, or any combinations thereof. The storage device 120 may also include remote storage drives. The computing device 100 may also include a network interface controller (NIC) 122 may be configured to connect the computing device 100 through the bus 106 to a network 124. The network 124 may be a wide area network (WAN), local area network (LAN), or the Internet, among others.

The computing device 100 and each of its components may be powered by a power supply unit (PSU) 126. The CPU 102 may be coupled to the PSU through the bus 106 which may communicate control signals or status signals between then CPU 102 and the PSU 126. The PSU 126 is further coupled through a power source connector 128 to a power source 130. The power source 130 provides electrical current to the PSU 126 through the power source connector 128. A power source connector can include conducting wires, plates or any other means of transmitting power from a power source to the PSU.

The computing device 100 may also include a distributed memory panel 132 located on the display devices 114 to distribute memory on a panel. In some examples, the distributed memory panel 132 may store image data to be displayed so that the computing device 100 does store them in a storage 120 or a memory device 104.

The block diagram of FIG. 1 is not intended to indicate that the computing device 100 is to include all of the components shown in FIG. 1. Further, the computing device 100 may include any number of additional components not shown in FIG. 1, depending on the details of the specific implementation.

Figure 2:
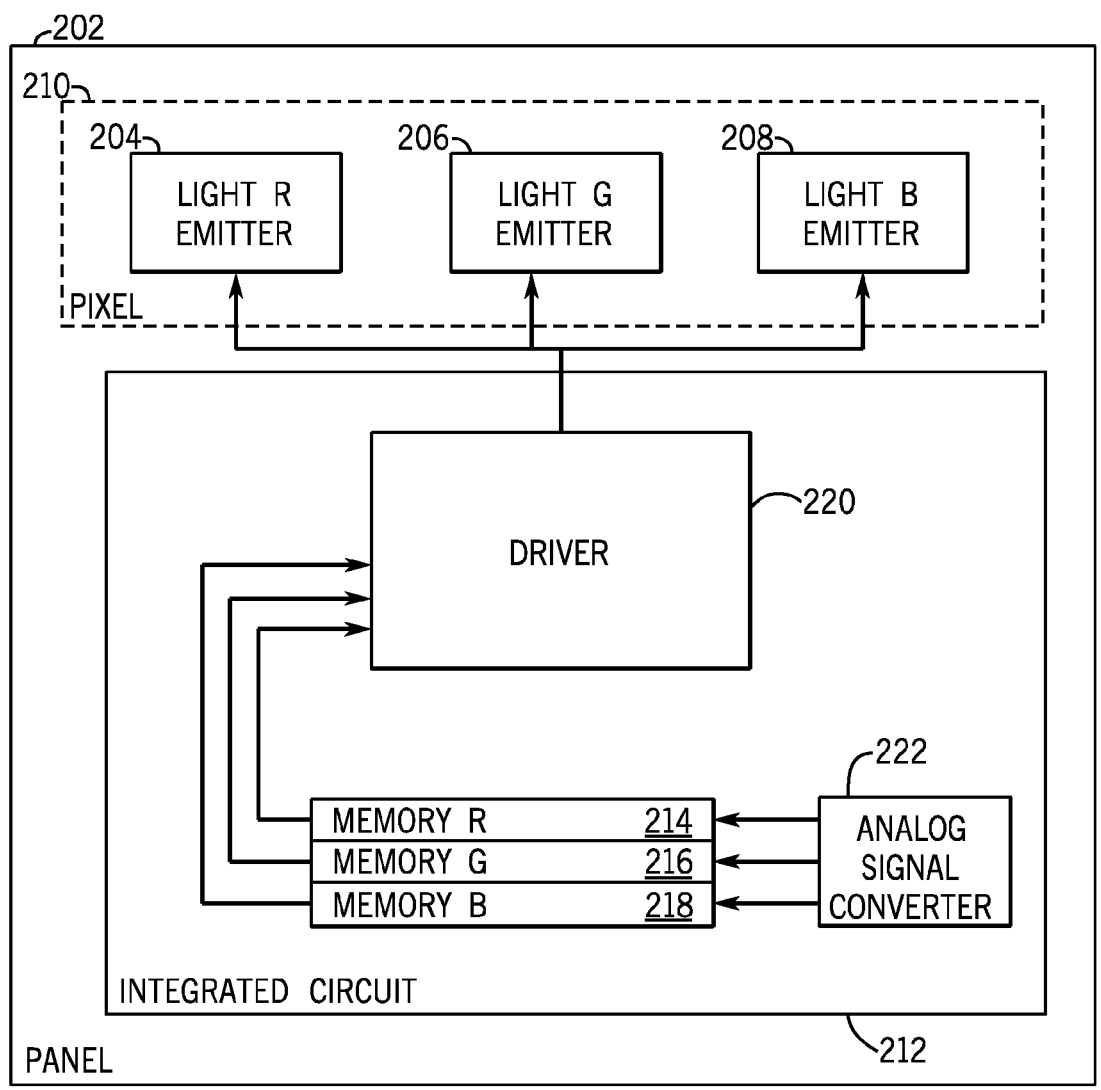
FIG. 2 is a schematic depiction of an integrated circuit containing substrate, according to one embodiment.

FIG. 2 is a simplified block diagram of an example of a distributed memory panel 202 with an analog signal converter. Like numbered features are as described in FIG. 1. The panel 202 may be used to display an image, picture, or other visual data. In some embodiments, the panel is a display of a computer device such as a computer screen or the display screen of a mobile phone.

The panel 202 may display an image through the use of light emitters including light emitter R 204, light emitter G 206, and light emitter B 208. In this figure each light emitter may represent a particular emitted color, such as light emitter R 204 emitting red light. However, the letter designations are for convenience, and it is understood that any color of light may be emitted by particular light emitter R 204, light emitter G 206, or light emitter B 208. Further, while each light emitter 204, 206, and 208 may be a light emitting diode (LED), other light emitting sources may be used as light emitters 204, 206, 208 including liquid-crystal display technology, plasma light emitting sources, organic light-emitting diodes (OLEDs), in-organic light-emitting diodes or micro-LEDs, and any other suitable light emitting sources. These light emitters 204, 206, 208 may each emit a different color at a different level, strength, or intensity such that as a group of light emitters, the number of light emitters 204, 206, 208 form a pixel 210. The pixel 210 may be any picture element that can be manipulated by a controller processing image data. In some examples, the pixel 210 may include three light emitters 204, 206, 208 each of a different color between R, G, and B. A pixel 210 is not limited or required to have three light emitters as some examples include light emitters for red, green, blue, and white light, while other pixels 210 may have other configurations and colors emitted. As used herein, Pixel 210 may refer generally to the smallest addressable element in an all points addressable display device 114. In some examples, a pixel may be the smallest controllable element of a picture represented on the panel 202.

The panel 202 is not limited to light emitters 204, 206, and 208 but may also include an integrated circuit 212. The integrated circuit 212 may be made of silicon and installed to a screen substrate such as glass of flex using manufacturing technologies such as micro pick and bond (MPB). These techniques may facilitate mass transfer of micron sized individual non-similar components which may be obtained from different substrates and install them on to a final substrate which may be glass or flex. The integrated circuit 212 may be associated with and used in conjunction with each light emitter 204, 206, and 208. In some examples, the integrated circuit 212 may include a memory R 214, a memory G 216, and a memory B 218. Although in FIG. 2 these memory elements are shown as separate elements, each memory 214, 216, and 218 may be part of a single addressable logical space, or may be separate addressable spaces for storage of data. Each memory R 214 may be exclusively associated with storing data for a light emitter R 204. Similarly, each memory G 216 may be exclusively associated with storing data for a light emitter G, and each memory B 218 may be exclusively associated with light emitter 208. In some examples each memory 214, 216, and 218 may be used to store digital data for the light emitters 204, 206, and 208 on to a set of Complementary Metal-Oxide-Semiconductor (CMOS) digital storage elements. CMOS digital storage elements may include a FlipFlop, a Latch, Static Random-Access Memorys (SRAMs), or any other storage element based on CMOS technology. Memory 214, 216, and 218 may also store data exclusively for a light emitter 2014, 206, or 208 based on a number value for that color that is stored in data block sizes including 4, 6, 8, 10, 12, or any other suitable number of bits per color.

The integrated circuit 212 on the panel 202 may also include a driver 220. The driver 220 on the integrated circuit 212 of the panel 202 may convert the digital values each associated with a light emitter intensity. The driver may convert these values stored in a memory 214 to an analog signal and send this signal to a light emitter 204 that may emit light at a particular level or intensity based on this signal. In some examples, digital values for each light emitter 204, 206, and 208 are driven by the driver 220 to each light emitter 204, 206, and 208 by a Pulse Width Modulation (PWM) method where the amount of time the an analog signal is On Vs the time an analog signal is Off is based on a grayscale value for a particular light emitter 204, 206, or 208 stored in a memory 214, 216, or 218.

Further, these values stored in each memory 214, 216, and 218 may originally be obtained from an analog signal converter 222. The analog signal converter 222 may receive analog data or signal for an image and may convert the analog data signal to digital so that it may be stored in a memory 214, 216, or 218.

One example of a benefit of this panel 202 is that in contrast with panels with analog backplanes, the panel 202 does not need constant refreshing when displaying a static image or partially static image. Previous analog backplanes stored values for each light emitter off-panel, and through analog means including storage in capacitors that were prone to leakage. In such systems, an analog signal would need to be repeatedly driven to the same capacitor at 60 Hz or other frequencies in order to maintain the display image even for static images. The presently disclosed panel 202 shows that a value for each light emitter 204, 206, 208 may be stored digitally in a memory 214, 216, 218 in an integrated circuit 212 on the panel 202. In some examples, once a value is stored digitally in a memory 214, 216, or 218 the panel 202 will not need to receive any signal for a particular light emitter 204, 206, or 210 unless the light intensity is to change.

In some examples, when a panel 202 is displaying a static image or a partially static image, any light emitter 204, 206, or 208 that is displaying a static portion of the image may continue to receive the same value from the integrated circuit 212 and a new signal may not be transmitted to the integrated circuit 212 for any memory 214, 216, 218 unless that memory 214, 216, or 218 is associated with a light emitter 204, 206, 208. Accordingly, energy may be saved as fewer signal transmissions may be needed especially when static images are commonly viewed on a distributed memory panel.

Thus, advanced display panel technologies may use micro pick and bond to get non-similar components like organic or inorganic light emitting diodes, and CMOS micro integrated circuits that replace the traditional thin film transistor, on a common substrate, as opposed to the industry standard thin film transistor back plane. These advanced display technologies make use of highly efficient light emitting sources, such as inorganic light emitting diodes and CMOS transistors based on micro integrated circuits with high mobility, hence, leading to their respective sizes being smaller than the current analog display technology.

In conventional micro LED displays, a substantial portion of the display panel active area is empty or can be populated with solar panel cells. In addition, voltage conditioning circuits that can work with the battery charging unit serve as an alternate source of power supply to the device to keep the device on through its trickle charge capability. Also, the corners or areas outside the active area of the display, such as bezel edges, can be populated with solar cells as well.

Described herein are micro pick and bond assembly techniques, micro pick-and-bond (µPnB) assembly equipment, and micro device assemblies. In contrast to other transfer printing methods, µPnB methods can integrate micro-devices without the complexity of high voltage electrostatic heads, and are compatible with high temperature solder bonding. In embodiments, micro pick-and-bond heads transfer micro device elements, such as (micro) LEDs, en masse from a source substrate to a target substrate, such as a LED display substrate. Anchor and release structures on the source substrate enable device elements to be separated from a source substrate, while pressure sensitive adhesive (PSA) enables device elements to be temporarily affixed to pedestals of a micro pick- and bond head. Once the device elements are permanently affixed to a target substrate, the PSA interface may be defeated through peeling and/or thermal decomposition of an interfacial material. The µPnB heads and assembly techniques described herein are particularly advantageous for integrating hundreds of thousands to many millions of micro devices onto an assembly substrate, for example to assemble a µLEDs into a display.

In certain exemplary embodiments described further below, a µPnB assembly head is completely passive, having no electrical components or circuitry, such as electrodes. A purely mechanical µPnB assembly head has the advantage of being less complex than electrically controlled heads such as those employing electrostatic force to pick up micro dice. In contrast to an electrostatic head, a passive µPnB assembly head in accordance with one or more embodiment described herein lacks electrostatic clamping electrodes. There is therefore no need for active high voltage control, and no need to build up and bleed off an image charge in each of the die during the assembly process.

Figure 3:
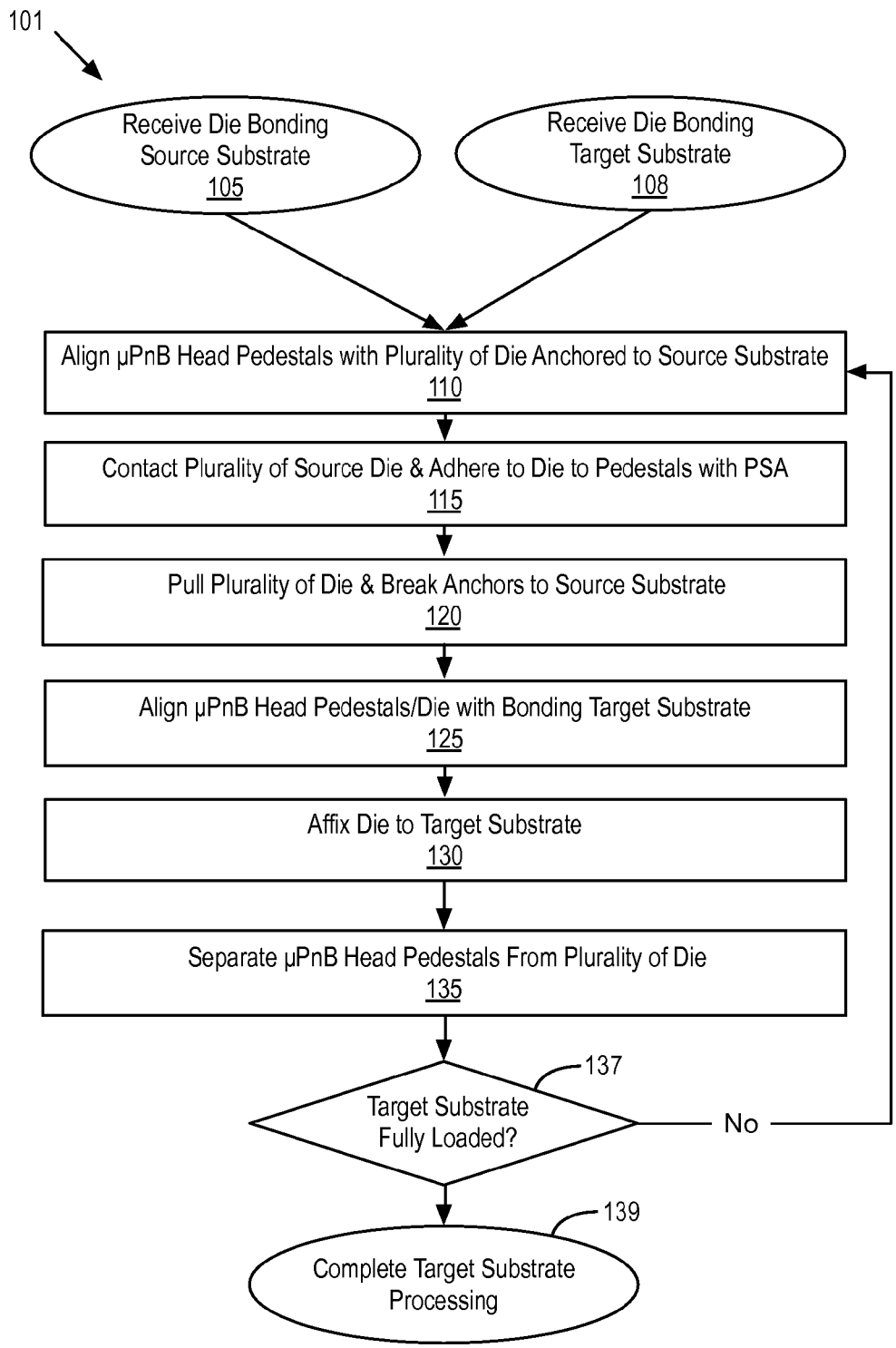
FIG. 3 is a flow diagram illustrating a micro-pick-and-bond (µPnB) method suitable for integrating micro device elements into an assembly, in accordance with embodiments.

FIG. 3 is flow diagram illustrating a micro-pick-and-bond (µPnB) method 101 suitable for assembling micro device elements (e.g., micro die) into an assembly, in accordance with embodiments. In one exemplary embodiment, the device elements are µLED dice assembled into a display assembly. Method 101 begins with receiving a die bonding source substrate at operation 105 and a die bonding target substrate at operation 108. The µPnB method 101 is to transfer one or more of the die from the source substrate to the target substrate. The die has lateral dimensions in the micron scale, for example no more than 10 µm. In the exemplary µLED embodiment, the µLED (also referred to herein simply as an LED) has a largest lateral length no more than 5 µm. The µPnB method 101 is highly scalable being suitable for devices (e.g., LEDs) in the 1-5 µm range, for example. For such embodiments, method 101 may be utilized for example to assemble a crystalline LED display. Although described herein in the context of a few or even a single device for the sake of clarity, the source substrate embodiments, target substrate embodiments, and µPnB assembly techniques exemplified are also understood to be applicable to concurrent pick-and-bond/assembly of a vast number of devices.

Figures 4A, 4B:
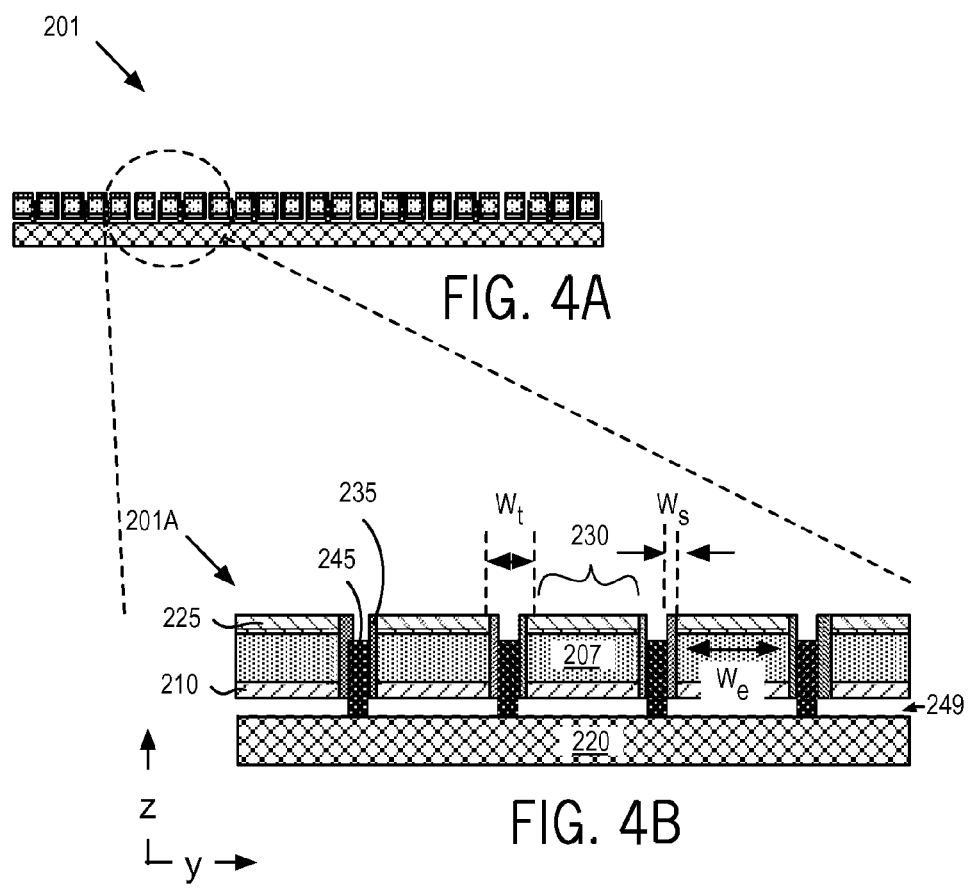
FIGS. 4A and 4B are cross-sectional views of exemplary crystalline LED elements in a µPnB source substrate, in accordance with embodiments.

In an embodiment, the source substrate received at operation 105 includes a plurality of devices, each including a device stack that has been fabricated at a wafer-level with some nominal source substrate device pitch. One or more of the devices in the source substrate are to be picked up and bonded to the target substrate, for example at some target substrate device pitch that may be an integer multiple of the source substrate device pitch to reduce wasted space on the source substrate. FIG. 4A is cross-sectional view of exemplary crystalline LED elements integrated in a µPnB source substrate 201, in accordance with embodiments. FIG. 4B is an expanded cross-sectional view of one embodiment (201A) for µPnB source substrate 201, in accordance with further embodiments.

Referring first to FIG. 4B, source substrate 201A includes a carrier 220, which may be any metal, semiconductor, or dielectric material having adequate flatness as subsequent bulk transfer of the LED elements from carrier 220 may be facilitated by greater flatness of carrier 220. In one advantageous embodiment, carrier 220 is a (mono)crystalline silicon substrate, for example a wafer of the type employed for IC fabrication. In another advantageous embodiment, carrier 220 is a glass substrate.

Source substrate 201A further includes crystalline LED elements 230 anchored to carrier 220. LED elements 230 may be rectangular (e.g., square) or patterned to have alternative shapes (e.g., a circular footprint). Each element 230 includes a LED film stack 207. Generally, any known semiconductor LED film stack may be utilized. In embodiments, LED film stack 207 includes one or more semiconductor heterojunction(s), for example forming a quantum well, etc. Semiconductor LED film stack 207 includes at least two complementary doped semiconductor regions (layers): a p-type doped layer and an n-type doped layer in a diodic stack architecture. In specific embodiments, semiconductor LED film stack 207 is a heteroepitaxial III-N semiconductor film stack, for example comprising GaN and/or alloys thereof, such as InGaN. The composition of semiconductor LED film stack 207 however is dependent on the desired emission band, and embodiments herein are not limited in that respect.

Each LED element 230 further includes an electrode metal 210 contacting the LED film stack. The composition of electrode metal 210 may vary as a function of the LED film stack, for example to provide a desired metal work function suitable for providing an ohmic contact, tunneling contact, etc. In one exemplary embodiment, metal 210 is a p-type metal suitable for making contact to p-type doped semiconductor layer of an LED film stack. Each LED element 230 further includes a second metal electrode 225 contacting the LED film stack. The composition of second electrode metal 225 may vary as a function of the LED film stack, for example to provide a desired metal work function suitable for providing an ohmic contact, tunneling contact, etc. In one exemplary embodiment, metal 225 is an n-type metal suitable for making contact to n-type doped semiconductor layer of an LED film stack.

Adjacent LED elements 230 are separated by trenches etched into the LED semiconductor film stack. The dimensions/pitch of the trenches substantially set the dimensions of the LED elements that will be incorporated into a display assembly. As illustrated in FIG. 4B, the trenches between LED elements 230 extend through the metal electrodes 225 and 210, and through the entire semiconductor LED film stack 207, defining sidewalls of each LED element. A dielectric sidewall spacer 230 is disposed over the LED element sidewalls. Sidewall spacer dielectric 235 may be any known dielectric material, such as but not limited to amorphous Si/C, SiOx, SiON, SiN, CDO, and CDN. Dielectric sidewall spacer 230 is conformally deposited over the LED elements and anisotropically etched to form an at least partially self-aligned sidewall coating over the metal and semiconductor sidewalls of each LED element.

In exemplary embodiments, the lateral element width We of each LED element 230 is patterned to be no more than 5 μm. In advantageous embodiments, the thickness of the dielectric material utilized for spacer formation is selected to ensure dielectric spacer 235 has a lateral thickness, or width Ws that is less than half the nominal lateral width Wt of the trenches 232 etched into the LED film stack at operation 935 (FIG. 9). The limitation on spacer width ensures two dielectric spacers on adjacent LED elements leave a portion of substrate material exposed at the bottom of the trenches to allow access of a release agent (e.g., substrate etchant). In exemplary embodiments, Ws is less than 0.1 μm.

LED elements 230 are anchored to carrier 220 for a controlled release of the LED elements 230 from carrier 220. The LED element anchors are formed within the trenches between adjacent elements, for example intersecting portions of the LED element sidewalls while still leaving access for a release agent to undercut the LED elements. Anchor material may be back filled into the trenches, planarizing with a top surface of LED elements 230, for example with a spin-on process. The planarized anchor material may then be recessed below the top surface of LED and/or patterned into a plurality of separate anchors. The recessed anchors avoid contamination to the μPnB head during pick up and further allow reduction of anchoring strength to ease the pickup. In one advantageous embodiment, the anchor material is a photosensitive polymeric material (e.g., photoresist) spin-coated into the trenches. Resist recess can be accomplished with well-known techniques such as a blanket ashing (both positive and negative resists), image reversal (positive resist) or a blanket development (negative resist). The photoresist is then lithographically patterned (i.e., exposed and developed) into separate LED element anchors 245 filling the trench and maintaining separation between adjacent LED elements 230 as further illustrated in FIG. 4B. The LED elements 230 remain affixed to the carrier only by the anchors 245. Anchors 245 landing on carrier 220 are surrounded by a free-space void 249 extending over the entire lateral area or footprint of each LED element 230. In the exemplary embodiments where a photosensitive polymer is employed for the anchor material, each anchor 245 is a polymer pillar contacting the sidewall dielectric (spacer 235) coating at least two adjacent LED elements 230 (e.g., four nearest LED elements 230 are connected by each anchor 245). In the form illustrated in FIG. 4B, LED elements 230 are ready for pick up and bonding to an LED display assembly.

Returning to FIG. 3, the target substrate received at operation 108 includes a plurality of lands arrayed over a surface of the target substrate. The target substrate may for example be a large format substrate with each land having been patterned and/or plated up at some nominal target substrate device pitch. One or more of the devices in the source substrate are to be picked up and bonded to the lands on the target substrate, for example at the target substrate device pitch much greater than the source substrate device pitch.

Figures 5A, 5B:
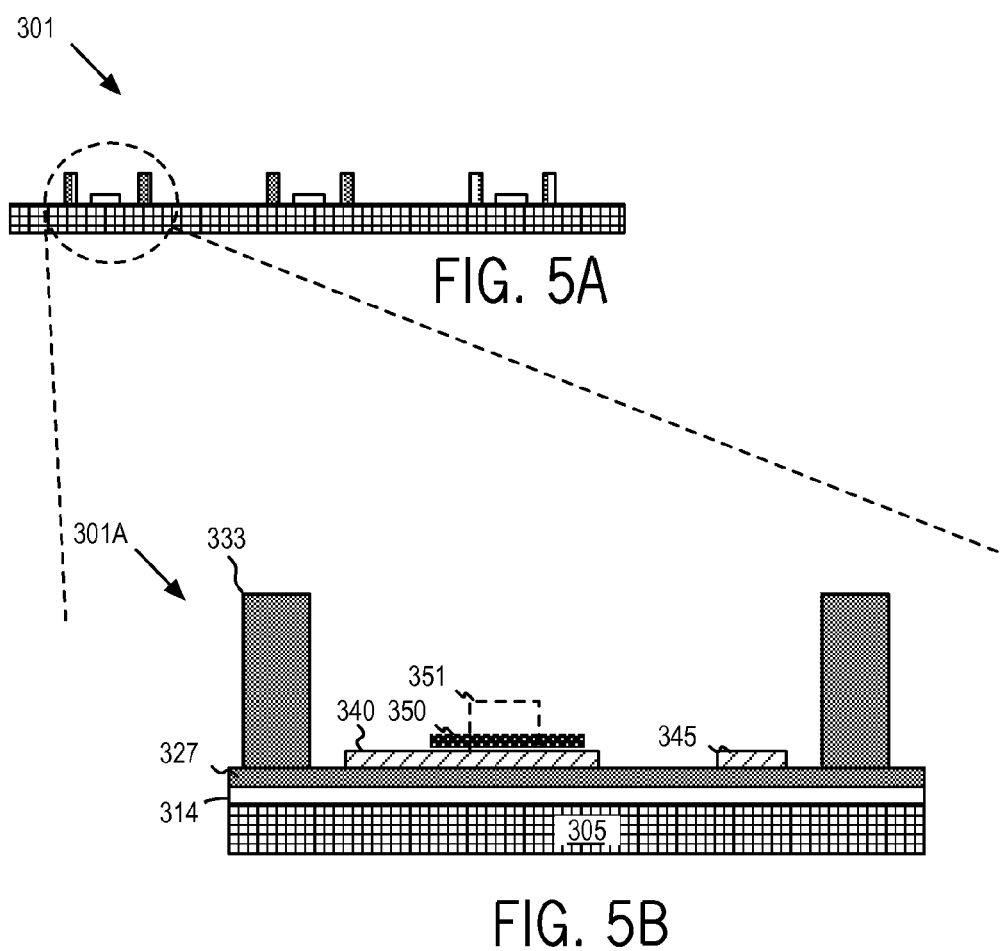
FIGS. 5A and 5B are cross-sectional views of exemplary structures in a µPnB target substrate, in accordance with embodiments.

FIG. 5A is a cross-sectional view of exemplary structures in a μPnB target substrate 301, in accordance with embodiments. FIG. 5A is an expanded cross-sectional view of one embodiment (301A) for μPnB target substrate 301. The μPnB target substrate 301A may be bonded, for example, with an LED element picked up from source substrate 201A (FIG. 4B).

Referring first to FIG. 5B, target substrate 301A includes a carrier 305. Carrier 305 can be either the display backplane, or a temporary substrate for building up the display. FIG. 5B further illustrates a temporary carrier embodiment in which carrier 305 is covered with a release layer 314. Release layer 314 may be any sacrificial material and in one example is a PSA material as further described below). Release layer 314 may also be an inorganic dielectric layer such as, but not limited to SiOx, which may for example form a compression bond with carrier 305. After build-up, the LED display assembly may be removed at release layer 314 and carrier 305 is then available for reuse after release. Carrier 305 may therefore be of any substrate material known in the art to be suitable for build-up that has sufficient flatness and has a sufficiently large area to accommodate the desired display area. The exemplary embodiment illustrated in FIG. 5A further includes a dielectric protection layer 327 to protect the LED display assembly after build up and release from carrier 305. Exemplary protection layer materials include SiON, SiN, and CDN. In alternate embodiments, dielectric protection layer 327 is absent.

Disposed over the carrier 305 is a display backplane interface having first metal interconnects that are to interface a first LED electrode with a display blackplane (e.g., driving circuitry, access transistors, and/or discrete electronics, etc.). In the exemplary embodiment illustrated in FIG. 5A, first metal interconnects 340 are pads arrayed over carrier 305.

For an exemplary embodiment where the LED display is to include an array of 5×5 µm LED elements, first metal interconnects 340 may be 10 µm metal pads having a pitch of around 25 µm. Second metal interconnects 345 are also metal pads arrayed (e.g., with a similar pitch) over carrier 305. Second metal interconnects 345 are to be electrically coupled to the second LED electrode, and so should be electrically isolated from first metal interconnects 340.

In embodiments, a µPnB target substrate has lands that include a solder feature or a conductive adhesive element. Target substrate 301A illustrates a conductive adhesive 350 applied to metal interconnect 340. Conductive adhesive 350 is to receive an LED element, affix the LED element to the bonding target substrate while the LED display assembly is built up around the LED element. In the exemplary embodiment, conductive adhesive 350 is to electrically connect one of the metal interconnects 340 to a metal electrode on a first (back) side of an LED element. In one advantageous embodiment, the conductive adhesive is a structural adhesive such as a photosensitive conductive film (e.g., a conductive photoresist). An example of such material is a photoresist (e.g., SU-8 25) doped with a conductive polymer (e.g., polyaniline). Some conductive photoresist formulations have been described in technical literature as having a resistivity in the range of 1 ohm-cm. At this resistivity, parasitic electrical resistance attributable to the conductive polymer of around 0.5 m thick, employed in accordance with embodiments herein is expected to be in the range of ~200 ohms for a 5×5 µm LED element. This resistance is much smaller than typical (p-type) contact resistance (e.g., >2 kohm) for an element of this size. Patterning and alignment of the conductive polymer elements is non-critical. For an exemplary 10 µm metal interconnect pad, the conducting polymer element may have a lateral dimension of 10-15 µm on a 25 µm pitch.

In another embodiment also illustrated in FIG. 5B, a solder element 351 is employed instead of a conductive adhesive 350 to permanently affix the die to the target substrate. Solder feature 351 may be a post or other structure of a solder material or a laminate stack of solder materials known to be compatible for any high temperature (e.g., over 150° C.) bonding process utilized for millimeter scale pick-and-place/compression bonding techniques. In one exemplary embodiment, solder feature 351 includes indium (In), which melts in the range of 160-180° C. Solder feature 351 may further include a Au layer that will also melt at similar temperature to form a Au—In alloy with a significantly higher (re)melt temperature. A bilayer of Au—Ti may also provide similar performance. Regardless of the solder material however, it is noted that the relatively high temperatures of solder bonding place additional constraints on the µPnB techniques described herein. For example, stand-off 333 is advantageously a material stable at high temperatures (e.g., stable to at least 190° C.) so that the high temperature bonding techniques may be utilized. In one example, stand-off 333 is a photoresist, such as SU-8.

In an embodiment, a µPnB target substrate further includes at least one mechanical stand-off adjacent a die land. Such stand-offs need not be adjacent to every die land on a source substrate, and may for example be distributed sparsely over the target substrate with enough density to ensure planar engagement between the µPnB head and the target substrate. FIG. 5B illustrates an exemplary stand-off 333 having a z-height greater than a z-height of the die (LED) land added to a z-height of a die (LED element) relative to the plane of the µPnB head to be affixed to the land. The mechanical stand-off(s) may be distinguished from a conventional collapse controller in that the stand-off is not to set a final z-height between a die and land, but rather to provide a mechanical stop to a surface of a µPnB head delivering the die as described further below. In exemplary embodiments where the z-height of the die land is a few microns or less (e.g., ~1 µm), stand-off 333 may be 6 µm, or less for a die z-height extending 5 µm from the µPnB head (e.g., LED 230 in FIG. 5B). In certain embodiments, stand-off 333 is a sacrificial material that is removed following die bond. In one such embodiment, stand-off 333 is photosensitive (e.g., a photoresist such as but not limited to SU-8). In such embodiments, stand-off 333 may be lithographically patterned, exposed and subsequently removed with known techniques.

Figure 6A:
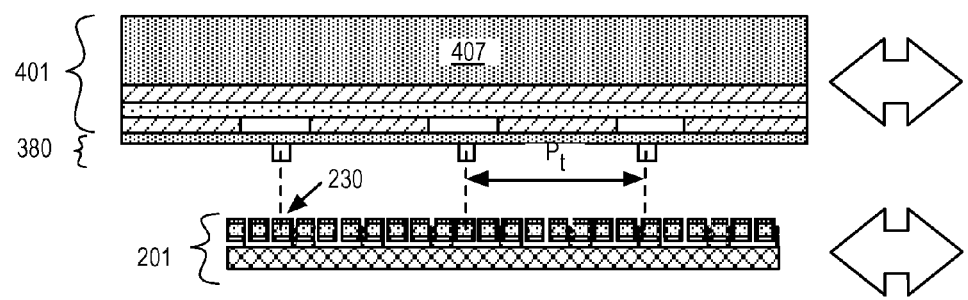
FIGS. 6A and 6B are cross-sectional views of exemplary operations as pick operations in a µPnB method are performed, in accordance with embodiments.
Figure 6B:
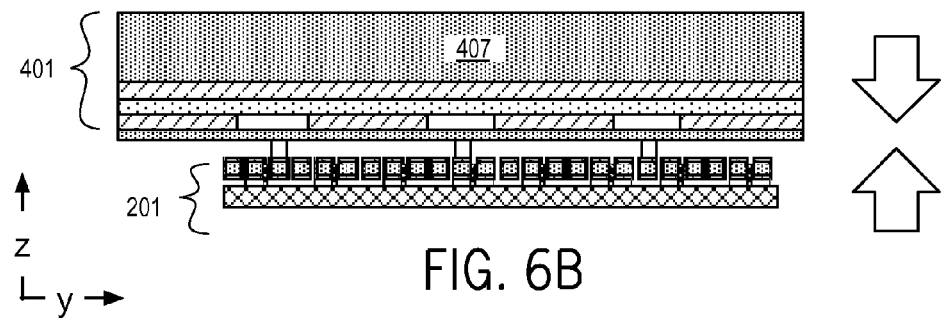

Returning to FIG. 3, µPnB assembly method 101 continues with die pickup beginning at operation 110 where a plurality of pedestals on a µPnB head are aligned with a plurality of die or device elements anchored to the source substrate. FIGS. 6A and 6B are cross-sectional views of exemplary operations as pickup operations in µPnB method 101 are performed, in accordance with exemplary LED embodiments. As shown in FIG. 6A, a µPnB head 401 includes a plurality of monolithic microtools 380 arrayed over a µPnB head substrate 407. The microtools 380 are arranged at a target pitch Pt predetermined to match or accommodate a particular land pitch on the bonding target substrate. The pedestal pitch Pt is further a multiple of the source device (LED element) pitch on the source substrate so that the plurality of microtools 380 may be concurrently aligned with a plurality of LED elements 230.

Returning to FIG. 3, µPnB assembly method 101 continues at operation 115 where the plurality of source die are contacted and adhered to the µPnB head pedestals with a pressure sensitive adhesive (PSA). As used herein, a PSA is an adhesive which forms bond when pressure is applied to adhere the adhesive with the adherend (e.g., the pedestal surface and/or die surface). A PSA is distinct from a structural adhesive typically employed to form a permanent bond. Whereas structural adhesives harden via processes such as solvent evaporation, UV radiation induced reactions, component reactions or thermal setting, no solvent (e.g., water), heat, or other cure (e.g., UV) is needed to activate the PSA. Once the PSA and adherend are in proximity, molecular interactions (e.g., van der Waals forces) prefect the bond. Pressure-sensitive adhesives are typically characterized by their shear and peel resistance as well as initial tack. The bond strength may be further influenced by the interface surface chemistry and the amount of pressure employed to press the plurality of die against the µPnB head pedestals. In advantageous embodiments, the PSA material employed at operation 115 is stable at high temperatures to facilitate subsequent bonding of die to a target substrate. In one exemplary embodiment the PSA material employed at operation 115 is stable to at least 180° C. and ideally stable at 250° C., or more (e.g., 300° C.). PSA material employed at operation 115 maintains sufficient shear strength to retain the die-pedestal bond at elevated die bond temperatures. In one exemplary embodiment, the PSA material employed at operation 115 is a silicon-based material including a siloxane polymer (Si—O—Si).

Returning to FIG. 3, µPnB assembly method 101 continues at operation 120 where the anchors between the die and the source substrate are broken by displacing the µPnB head pedestals relative to the source substrate while the die are adhered to the pedestals with the PSA material. The peel strength of the PSA material is compatible with the bond strength of the source substrate anchors to ensure the PSA bond can overcome the source substrate anchor. In exemplary μLED embodiments, a PSA peel strength less than 1 N/cm may be adequate for properly selected anchor materials and designed structures. In an exemplary embodiment, the anchoring force on a 51 μm×5 μm LED can be less than 10 μN vs. a peel force of 100 μN with a peel strength of 0.2N/cm.

Figure 7A:
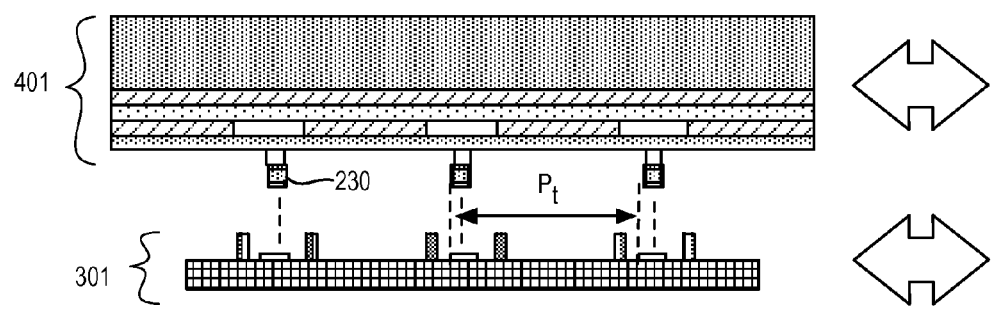
FIGS. 7A and 7B are cross-sectional views of exemplary operations as bond operations in a µPnB method are performed, in accordance with embodiments.
Figure 7B:
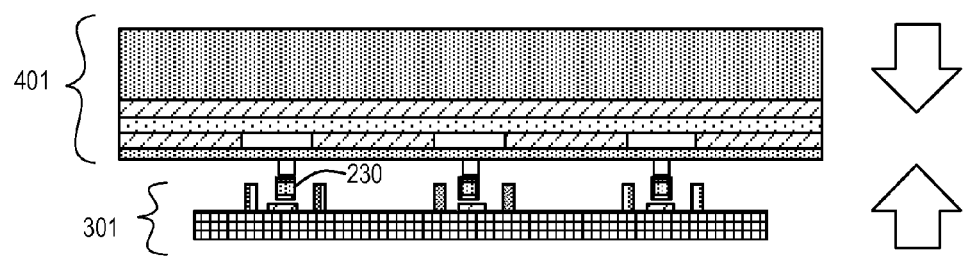

Returning to FIG. 3, μPnB assembly method 101 continues to the bonding stage where the dies picked up at operation 120 are now transferred to a target substrate. At operation 125, the plurality of die affixed to the μPnB head pedestals are aligned with lands on a bonding target substrate. At operation 130, the plurality of die is affixed to the lands of the bonding target substrate. Operation 130 may entail any solder bond/compression bond process known to be suitable for die on the millimeter scale. FIGS. 7A and 7B are cross-sectional views of exemplary operations as the bond operations in μPnB method 101 are performed, in accordance with exemplary LED embodiments. As shown in FIG. 6A, working surfaces of microtools 380 at the target pitch Pt are aligned to lands on the bonding target substrate 301. FIG. 6B illustrates the LED elements 230 being joined to the target substrate 301 as the μPnB head 401 is pressed against the target substrate 301. In one example, target substrate 301 is heated to slightly below a solder reflow/melt temperature, while the μPnB head 401 is heated to a temperature above the solder reflow temperature. Pressure may be applied between μPnB head 401 and target substrate 301. The μPnB head 401 locally heats the solder feature above the solder reflow temperature, forming a solder joint that is then cooled. Alternatively, operation 130 may entail an adhesive bond process including, for example, a UV or thermal curing and/or drying of a structural adhesive pre-applied to the target substrate or pre-applied to the die while the die is temporarily affixed to μPnB head 401. In one advantageous embodiment, room temperature compression bonding is employed to affix the plurality of LED elements 230 to conductive adhesive elements on target substrate 301. In a further embodiment, the room temperature bond is utilized for an initial bond, which is followed with a high temperature (e.g., 140-180° C.) curing, and/or UV curing of the conductive adhesive.

Returning to FIG. 3, the PSA bond between each micro die/chip and each assembly head pedestal is then broken or otherwise defeated at operation 135, leaving the die affixed to the target substrate. In one exemplary embodiment, the PSA bond between the die and the μPnB head pedestal is defeated by displacing the μPnB head pedestals relative to the target substrate while the die are affixed to the lands.

The μPnB assembly method 101 may then be iterated through the pickup and bonding operations described above until a die (e.g., LED element) is bonded to all lands on the target substrate (diamond 137). After attaching all source dice to the target substrate, the target substrate may be further processed to complete interconnection and/or encapsulation of the micro devices assembled onto the target substrate (see oval 139). Any assist structures (e.g., standoffs 333) fabricated on the target substrate to facilitate μPnB assembly may also be removed.

Figure 8A:
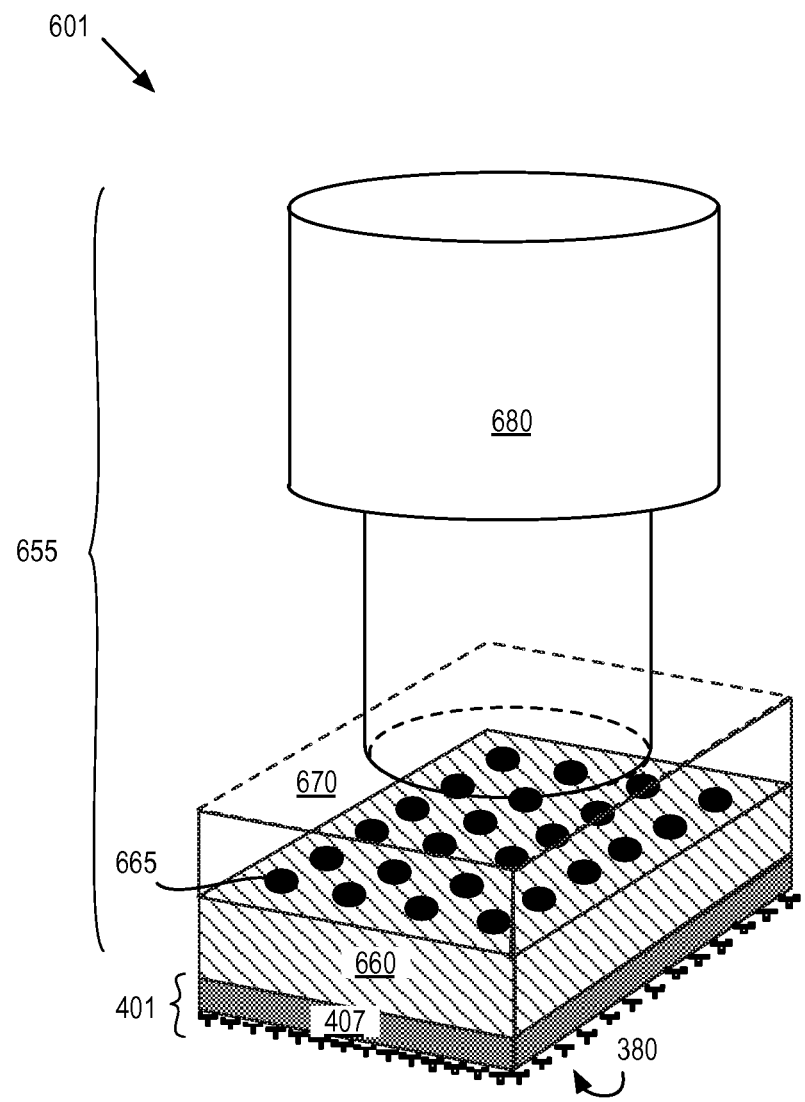
FIG. 8A is an isometric view of an exemplary µPnB assembly took, in accordance with embodiments.
Figure 8B:
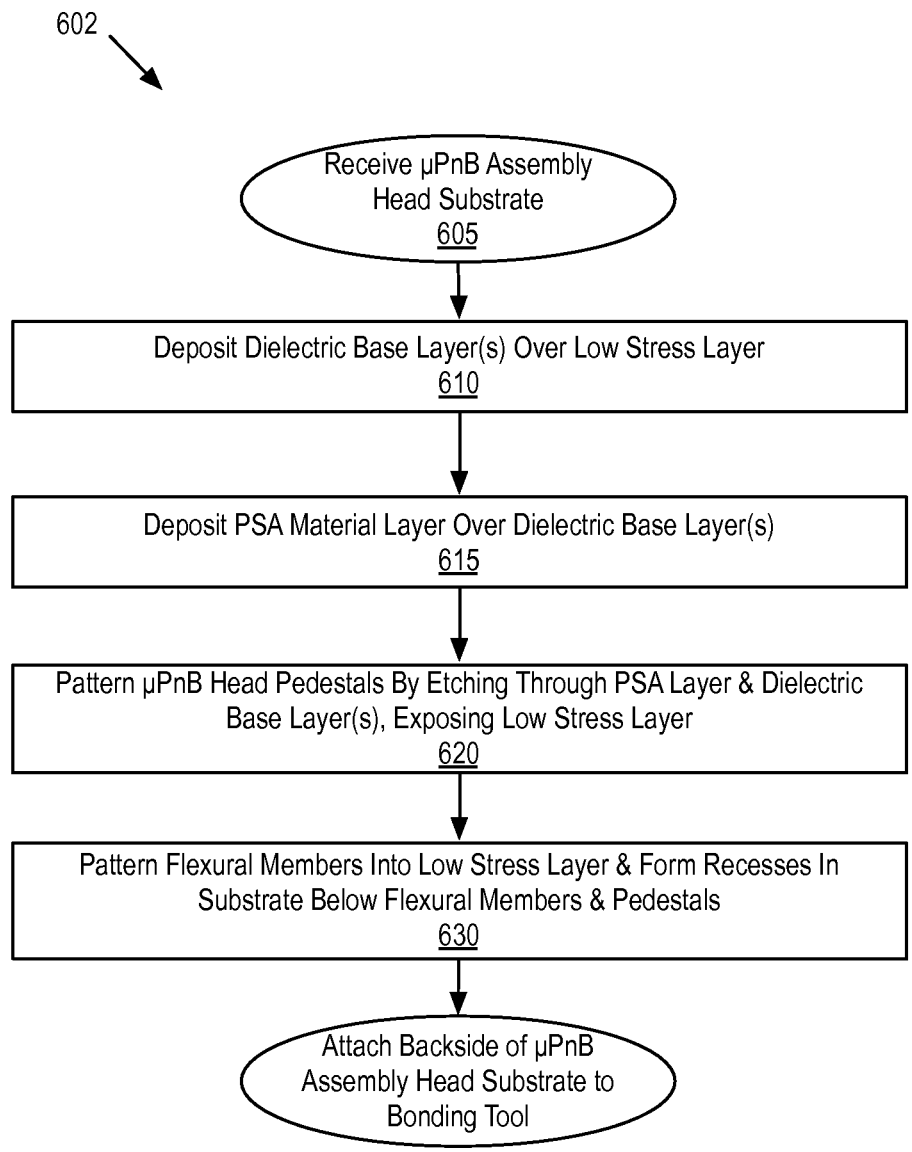
FIG. 8B is a flow diagram illustrating a method of fabricating a µPnB head with the µPnB assembly tool illustrated in FIG. 8A, in accordance with embodiments.

Notably, successful execution of μPnB assembly method 101 depends, at least in part, on the source and target substrates having sufficient flatness, and/or the μPnB assembly head having sufficient flatness. In advantageous embodiments, the μPnB assembly head includes microtools capable of accommodating a threshold level of non-planarity between the μPnB assembly head pedestals and the target substrate. FIG. 8A is an isometric view of an exemplary μPnB assembly tool 601 that may be utilized to perform μPnB assembly method 101, in accordance with embodiments. FIG. 8B is flow diagram illustrating a method 602 for fabricating μPnB assembly head 401 incorporated into the μPnB assembly tool 601, in accordance with certain embodiments where the PSA material is provided on the μPnB assembly head pedestals. FIGS. 9A-9G are cross-sectional views of an exemplary μPnB assembly head as selected operations in method 602 are performed, in accordance with first embodiments. FIGS. 10A-10D are cross-sectional views of an exemplary μPnB head as selected operations in method 602 are performed, in accordance with alternate embodiments.

Referring first to FIG. 8A, μPnB assembly tool 601 includes a die compression bonder 655 fitted with μPnB assembly head 401. In the example illustrated in FIG. 8A, compression bonder 655 includes an articulated robotic arm or gantry 680. As in typical thermal compression bonding tools, the gantry 680 may contain mechanisms for moving the tool around in XYZ directions and gimbals for adjusting the plane of the bond head. A millimeter scale bonder interface 670 mates with a back side of μPnB assembly head substrate 407, for example through a precisely flattened vacuum block 660 that includes a plurality of gas passages 665 for pressure/vacuum control between bonder interface 670 and μPnB assembly head substrate 407. Microtools 380 then provide a working surface while μPnB assembly head substrate 407 is affixed to bonder 655. In exemplary embodiments described further below, each microtool 380 includes a pedestal to contact micro die coupled to a flexural member that is to conform to imperfectly flat source and target bonding substrates.

The μPnB assembly tool 601 may be built up by operating any known pick-n-place/compression die bonder to first pick up μPnB assembly head 401. The μPnB assembly head 401 is to be successively placed on a bonding source substrate and a bonding target substrate to transfer a plurality of micro die between the source and target substrates with each iteration. When μPnB assembly head 401 is placed on the bonding source substrate, microtools on head 401 temporary bond with the source die (e.g., with PSA material) to defeat the source substrate anchoring. When bonder 655 (re)places the μPnB assembly head 401 onto the bonding target substrate, the permanent bond formed between the die and target defeat the temporary bond with the μPnB assembly head 401. Then bonder 655 (re)places the μPnB assembly head 401 onto the bonding source substrate for another μPnB iteration. In the event μPnB assembly head 401 becomes aged, (e.g., after one or more placements between bonding source and target substrates), bonder 655 drops the aged μPnB assembly head 401 between micro die μPnB iterations and picks up a replacement μPnB assembly head 401 from a μPnB head tray. In this manner, μPnB assembly head 401 interacts with compression bonder 655 much like any millimeter-scale die. However, once picked up by bonder 655, the μPnB assembly head 401 serves as further tooling enabling compression bonder 655 to perform a μPnB assembly method (e.g., μPnB assembly method 101).

FIG. 8B further illustrates a μPnB assembly head fabrication method 602 by which microtools including a pedestal coupled to a flexural member are monolithically fabricated on a μPnB assembly head substrate. A head substrate received at operation 605 may be any substrate suitable for MEMS fabrication, such as, but not limited to, glass, silicon, germanium, SiGe, III-V compounds like GaAs, InP, III-N compounds like GaN, 3C—SiC, and sapphire to name a few. In one advantageous embodiment further illustrated in FIG.

9A, a head substrate 407 comprises glass or crystalline silicon having a site flatness of less than 0.1 µm for an 8×25 mm site. In the exemplary embodiment, head substrate flatness is further enhanced through thermal surface oxidation of a silicon substrate that forms a stoichiometric silicon dioxide (SiO2) layer 718 disposed a head substrate 407.

Referring again to FIG. 8B, µPnB assembly head fabrication method 602 continues at operation 610 where a dielectric base layer is deposited over a low stress material layer disposed on the head substrate. While the exemplary embodiment illustrates both a dielectric base layer and low stress layer, in alternative embodiments (e.g., where a PSA material layer is thick enough to provide sufficient compliance) these underlayment layers are absent with subsequent material layers (e.g., PSA) deposited directly on the substrate. Both the low stress material and overlying dielectric base layer may be deposited as part of method 602, or an incoming substrate received at operation 605 may include either/both material(s). The low stress material layer(s) may be of any composition suitable for forming a flexural member having a controlled spring constant using any known MEMS/IC fabrication technique. In one exemplary embodiment, the low stress material is an Al/Cu alloy film of approximately 1 µm in thickness. The low stress material layer may be annealed as needed. In another exemplary embodiment, the low stress material is a silicon device layer of an SOI substrate. The dielectric base layer deposited over the low stress material layer(s) is advantageously a material that can be deposited to a thickness of 1-5 µm, is stable at high temperature (e.g., over 250° C.), and is amenable to patterning. In advantageous embodiments the dielectric base layer material is an organic polymer that can be spin-coated onto the head substrate and then cured and/or dried. One exemplary organic polymer is polyimide (PI).

At operation 615, PSA material is deposited over the substrate (e.g., over the head assembly material stack). The PSA material may be any known material that has a peel force suitable for the application (e.g., <1 N/cm). In further embodiments where the PSA material is to withstand high temperature die bonding, the PSA material is also stable at high temperatures. For example, the PSA material may be silicone-based (e.g., a siloxane polymer), as described above. In advantageous embodiments the PSA material is applied be spin-coating a silicone-based polymer mixture onto the head substrate and then curing and/or drying the mixture into the PSA material layer.

Figure 9A:
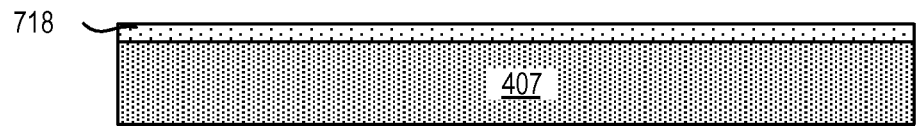
FIGS. 9A, 9B, 9C, 9D, 9E, 9F, and 9G are cross-sectional views of an exemplary µPnB head as selected operations from the method illustrated in FIG. 6B are performed, in accordance with embodiments.
Figure 9B:
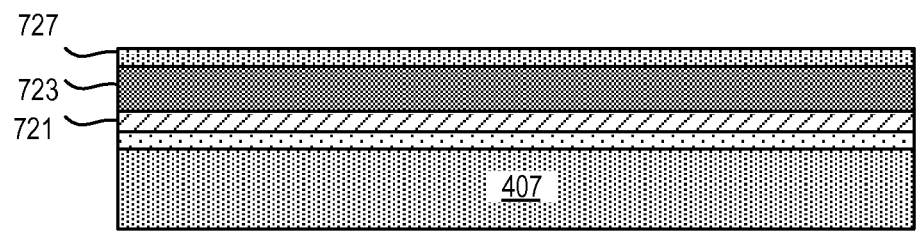
Figure 9C:
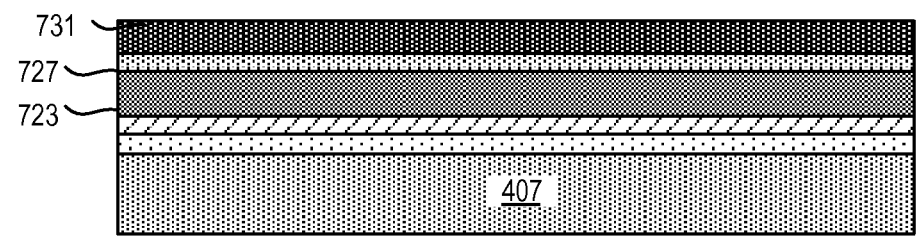

FIG. 9B further illustrates a head substrate following operation 610 where a low stress material layer 721 (e.g., AlCu) is deposited over stoichiometric SiO2 layer 718 on a silicon substrate 407. A high temperature compatible dielectric base layer 723 is disposed on low stress material layer 721 and a capping layer 727 is deposited over dielectric base layer 723. Although optional, capping layer 727 may advantageously separate dielectric base layer 723 from the overlying PSA layer 731 (FIG. 9C). Depending on the composition of dielectric base layer 723 and PSA material layer 731, an intervening material, such as but not limited to SiON, may improve adhesion and or facilitate patterning of the PSA layer 731 and/or dielectric base layer 723. In an embodiment where PSA is placed on LED instead of the µPnB head, material for layer 727 may be selected to fine tune adhesive and peeling forces. In advantageous embodiments, the material for layer 727 can be chosen to enable optical metrology for detecting the plane of the pedestals fabricated out of the dielectric base layer 723. For example, a metallic layer 727 can serve as a mirror, or a dielectric layer of different optical index from the adjacent layers 723 and 731 can enhance reflection for better signal.

Figure 9D:
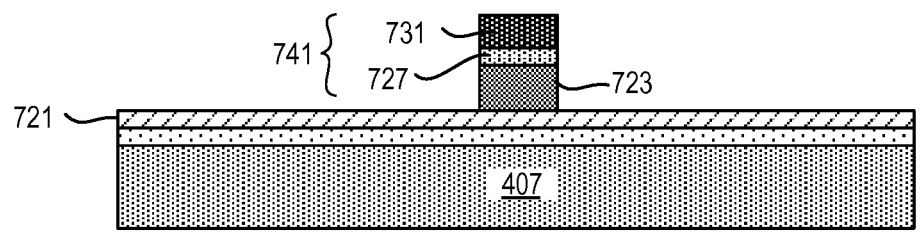

Returning to FIG. 8B, µPnB head fabrication method 602 continues at operation 620 where a plurality of µPnB head pedestals are patterned into the head assembly by etching through at least the PSA layer and further through the underlying dielectric material layer (when present) to expose the low stress layer (when present). FIG. 9D illustrates a pedestal 741 disposed on low stress layer 721. Pedestal 741 may be dimensioned and spaced apart from other pedestals (not depicted) according to specifications of the target bonding substrate. For example, in embodiments where pedestal 741 is to pick up a µLED having a 1-5 µm lateral dimension, pedestal 741 has a lateral dimension (e.g., y-dimension) also of 1-51 µm. In one advantageous embodiment, pedestal 741 has a circular footprint with a diameter of approximately 3 µm. To pattern pedestal 741, a photoresist may be spin coated over the material layer 731. In some embodiments, a thin oxide layer (not depicted) is disposed over the PSA material layer 731 to facilitate resist processing incompatible with the PSA material. The PSA material may be removed by either dry etch or solvent. In certain polyimide embodiments, the dielectric base layer 723 is photo-definable polyimide. A positive tone photo-definable PI may be lithographically patterned with the same mask and the same exposure employed to pattern the PSA material. In certain polyimide embodiments (e.g., non-photo-definable PI), the patterning may entail performing any known dry etch after removal of capping layer 727 and PSA layer 731.

Returning to FIG. 8B, µPnB assembly head fabrication method 602 continues at operation 630 where the low stress layer (if present) is patterned into a plurality of flexural members, each flexural member physically coupled to at least one pedestal. Together, the flexural member and the pedestal form the microtool 380 (FIGS. 6A, 8A). The flexural members are to elastically deform/deflect relative to the assembly head substrate during µPnB assembly operations. The flexural members provide compliance or travel to the pedestals sufficient to accommodate a threshold level of flatness in the source bonding substrate and/or target bonding substrate so that contact can be made between each pedestal and the device and/or landing pad on source/target substrate. In exemplary embodiments, each flexural member is elastically deformable by at least 0.1 µm in a direction perpendicular to the substrate surface. Each flexural member may be fabricated with lateral dimensions that complement the low stress material film thickness to achieve a desired spring constant and a strength sufficient to survive die pick up, bonding, and head separation. In exemplary embodiments where the PSA material has a peel strength of no more than 1.0 N/cm, each flexural member is dimensioned to have a spring constant of 100-600 N/m. The flexural member is dimensioned to support the pedestal. In other words the pedestal base completely floats on the flexural member, being coupled to the assembly head substrate only via the flexural member.

Figure 9E:
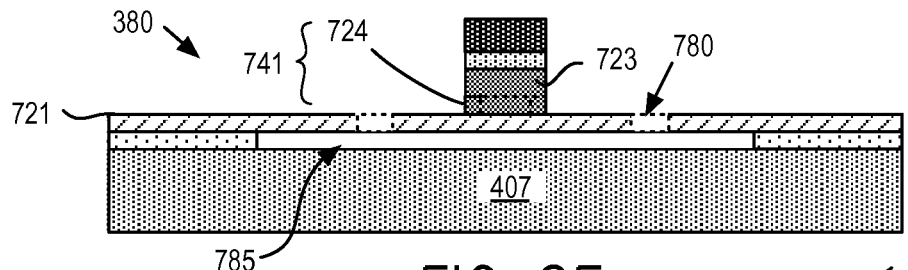
Figure 9F:
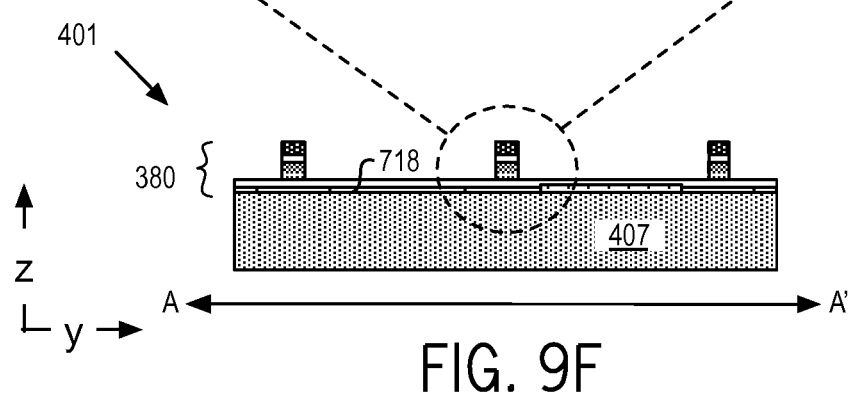
Figure 9G:
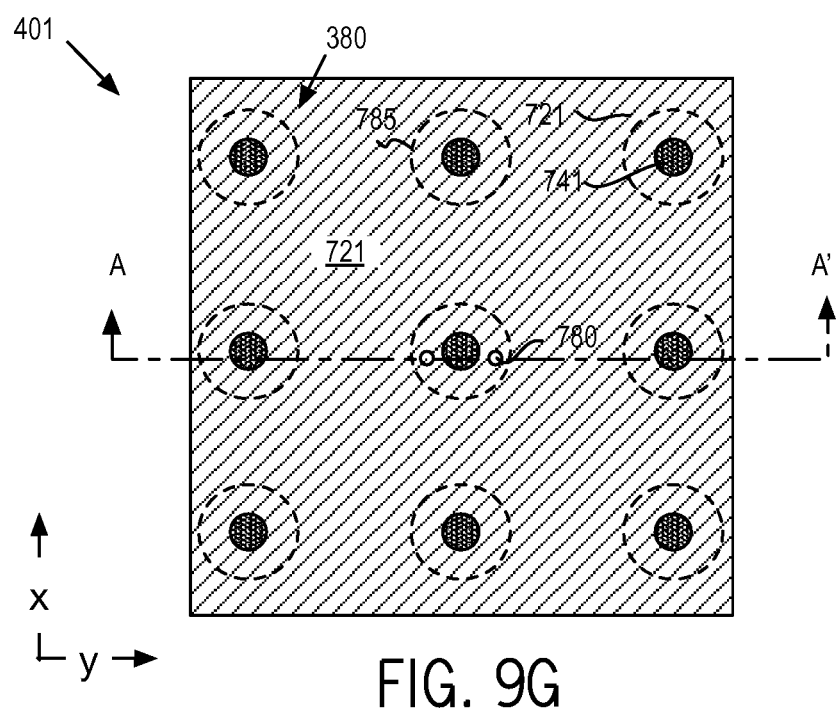

In an embodiment, fabrication of each flexural member at operation 630 entails etching a portion of the low stress layer and etching a recess in the substrate that undercuts the flexural member below the pedestal. The flexural member then extends over the recess allowing deflection of the flexural member in a direction perpendicular to the substrate surface. FIGS. 9E and 9F illustrate an exemplary microtool 380 after delineation and release of the flexural member. FIG. 9G illustrates a plan view of a plurality of microtools 380. As shown in FIG. 9E, release openings 780 are formed in low stress layer 721. A recess or void 785 is formed below pedestal 741. Low stress layer 721 then forms a membrane or diaphragm, which supports pedestal 741 over recess 785. As further illustrated in FIG. 9G, the low stress layer 721 is patterned into discrete membranes. In an advantageous embodiment, low stress layer 721 and layer 718 may be continuous over the μPnB assembly head with only the recess 785 discretely defined around each pedestal 741. By not removing layers 721 and 718, the topography of the substrate 407 is reduced, making it easier for metrology and used as the reference surface for mechanical stops 333 (FIG. 7A). Although circular flexural members are illustrated in the exemplary embodiment, flexural members may take other forms where the pedestal is still coupled to a region of the flexural member between two anchoring points that contact the substrate surface. In alternative embodiments, the pedestal may be coupled to the substrate through a flexural member having only one anchor point (e.g., cantilevered) or having two discrete anchor points (e.g., a bridge).

Figure 10A:
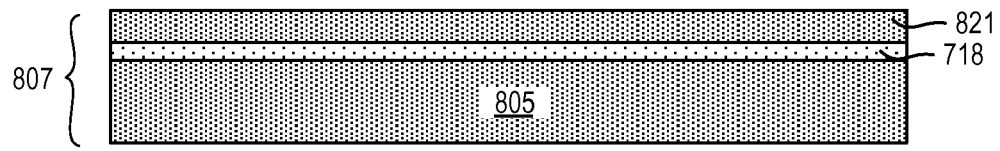
FIGS. 10A, 10B, 10C, and 10D are cross-sectional views of an exemplary µPnB head as selected fabrication operations are performed, in accordance with alternate embodiments.
Figure 10B:
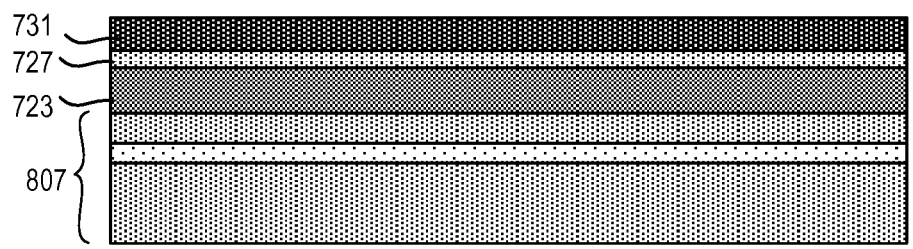
Figure 10C:
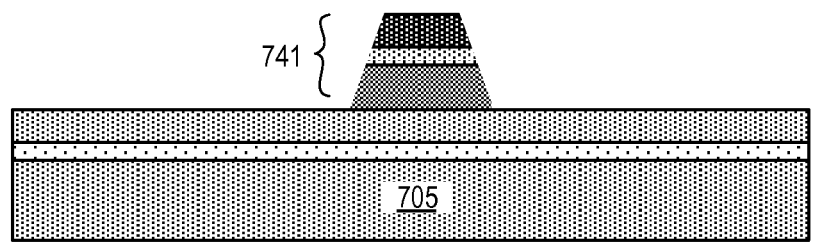
Figure 10D:
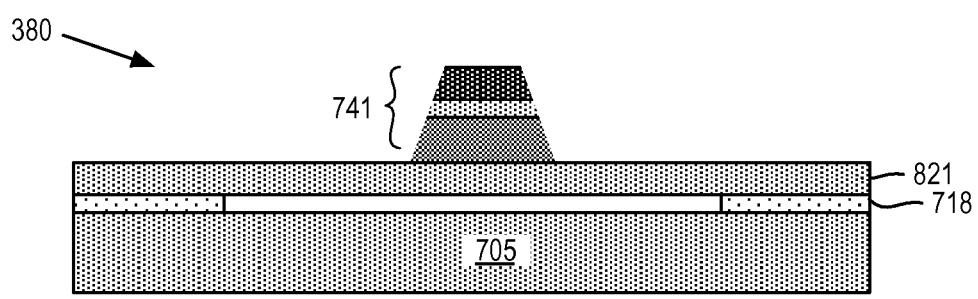

FIGS. 10A, 10B, 10C, and 10D are cross-sectional views of an exemplary μPnB head as selected fabrication operations from method 602 (FIG. 8B) are performed, in accordance with alternate embodiments. FIG. 10A illustrates an exemplary silicon-on-insulator (SOI) substrate 807 received as a starting material. SOI substrate 807 includes a (mono) crystalline silicon device layer 821 separated from a (mono) crystalline silicon substrate base 805 by a dielectric layer 718 (e.g., SiO2). A pedestal material film, or film stack, is deposited over SOI substrate 807 substantially as described above. In the exemplary embodiment, dielectric base material 731 is a photosensitive PI. Barrier layer 727 (e.g., TiN) is deposited over dielectric base material 723, and PSA material 731 is deposited over dielectric barrier layer 727. A photoresist mask is formed over the pedestal material film stack. In an advantageous embodiment, a thin dielectric layer, (e.g., SiOx) can be deposited on PSA 731 prior to photoresist deposition. The inter layer can eliminate chemical incompatibility between the resist and PSA, enhance resist adhesion, and can also serve as a hardmask for subsequent patterning. The SiOx interlayer can be easily removed during the undercut etch of the buried oxide 718. Unmasked PSA material 731 and barrier layer 727 is removed, and a flood exposure of the dielectric base material 731 completes patterning of the pedestal 741.

Following the patterning, many polyimide materials require high temperature curing. In some embodiments, where the curing temperature may be too high for PSA 731, PI is instead cured prior to depositing layers 727 and 731. The cured PI may then be dry etched after the removal of layers 727 and 731 instead of the flood exposure described above. In the exemplary embodiment illustrated in FIG. 10C, the dielectric base layer and/or the PSA is printed with a positive sidewall slope. In such embodiments, the pedestal base has a larger lateral dimension than the PSA material at the top surface of the pedestal to improve mechanical stability. As further illustrated in FIG. 10D, a portion of device layer 821 disposed below pedestal 741 is etched to open holes for undercut etch of the dielectric layer 718 and released from base substrate 705 to form a flexural member. Microtool 380 is then substantially complete and the monolithic assembly head substrate including a plurality of monolithic microtools 380 is ready for singulation and pick up.

As noted above, in some embodiments, a sufficiently thick PSA layer 731 alone provides adequate compliance for sufficiently planar source and target substrates and complexities associated with the flexural member may be avoided. For such embodiments, the microtool 380 includes just the pedestal 741 without any underlying flexural member. In certain such embodiments, substrate 805 may be a regular crystalline silicon wafer without the device layer 821 and the intervening dielectric layer 718.

Figure 11:
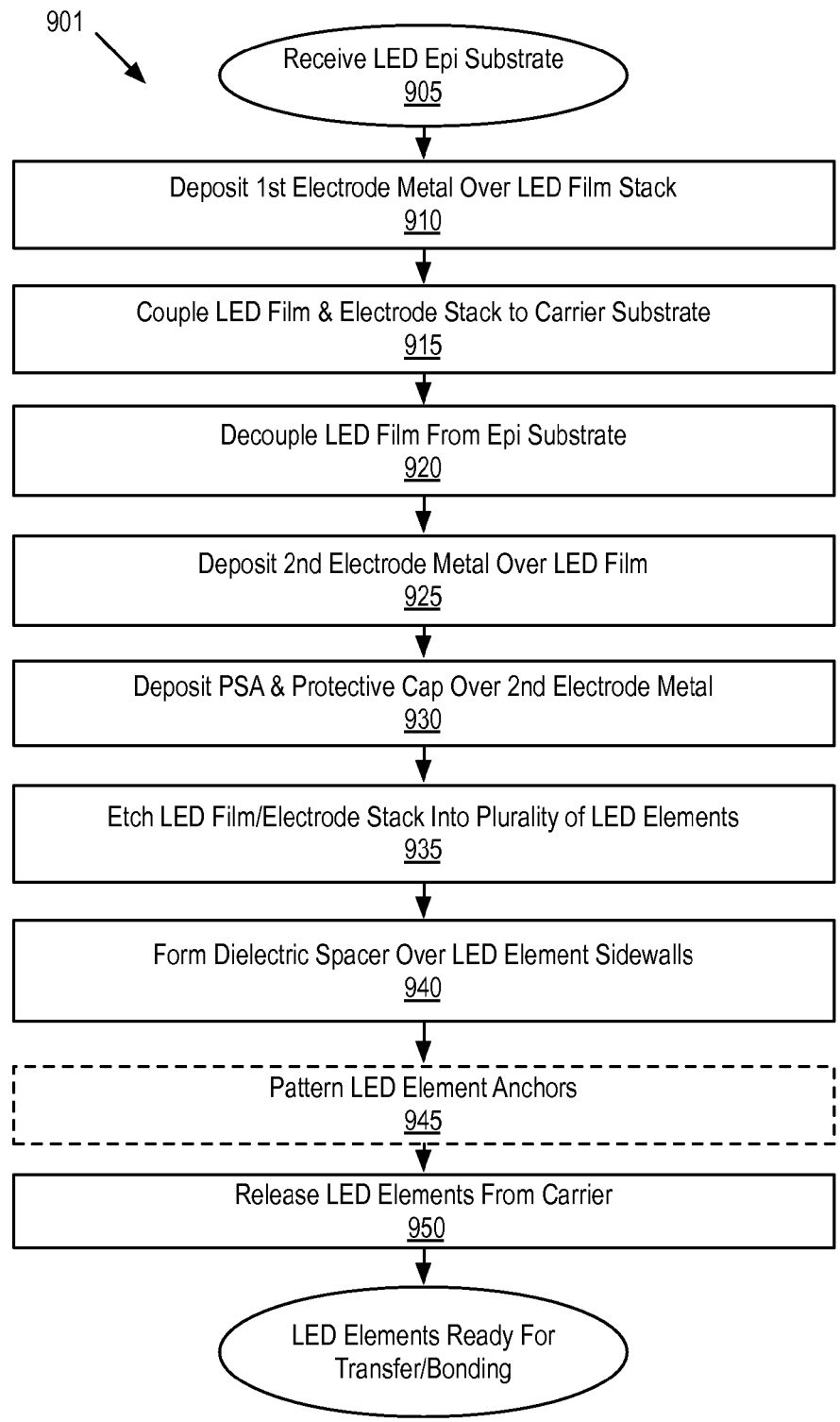
FIG. 11 is a flow illustrating a method of fabricating a µPnB source substrate including crystalline LED elements suitable for assembly into a display, in accordance with embodiments.

In embodiments, the μPnB source substrate includes a PSA material. PSA material may be incorporated into the source substrate in addition to, or in the alternative to, incorporation of PSA material into a μPnB assembly head. FIG. 11 is a flow illustrating a method 901 for fabricating a μPnB source substrate including crystalline LED elements suitable for assembly into a display. FIGS. 12A-12I provide cross-sectional views of exemplary crystalline LED elements as operations of the method 901 are performed, in accordance with embodiments. The same techniques may be directly applied to any micro device/die (e.g., any micron dimensioned IC or photonic chip, etc.).

Method 901 entails wafer-level processing suitable for generating the LED source substrate from a semiconductor LED film stack received at operation 905. The semiconductor LED film stack may be a contiguous film covering an epitaxial substrate to form a monolithic body (e.g., an LED epi wafer). Generally, any known semiconductor LED film stack may be utilized. In the exemplary embodiment illustrated in FIG. 10A, epi wafer 1001 includes an epitaxial substrate 1005, a buffer layer 1006 and semiconductor LED film stack 207 epitaxially grown on buffer layer 1006. In embodiments, LED film stack 207 includes one or more semiconductor heterojunction, for example forming a quantum well, etc., as described above in the context of FIG. 2A. Epitaxial substrate 1005 may be any know substrate suitable for growing an LED semiconductor film stack. For example, substrate 1005 may be a variety of materials, including, but not limited to, silicon, germanium, SiGe, III-V compounds like GaAs, InP, III-N compounds like GaN, 3C—SiC, and sapphire to name a few. Buffer layer(s) 1006 may be of any known architecture suitable for transitioning from the composition/microstructure of epitaxial substrate 1005 to that of LED film stack 207.

Returning to FIG. 11, method 901 continues with operation 910 where an electrode metal is deposited over the LED film stack. The composition of electrode metal may vary as a function of the LED film stack, for example to provide a desired metal work function suitable for providing an ohmic contact, tunneling contact, etc. In one exemplary embodiment, the metal deposited at operation 910 is a p-type metal suitable for making contact to p-type doped semiconductor layer of an LED film stack. Any known deposition technique, such as but not limited to PVD, CVD, electrolytic, or electroless plating may be utilized at operation 910. As further illustrated in FIG. 12B, a p-type metal film 210 is blanket deposited over a p-type doped semiconductor layer of an LED film stack 207.

Returning to FIG. 11, method 901 continues with operation 915 where the LED film and metal electrode stack is coupled to a carrier. At operation 920, the LED and metal electrode stack is decoupled from the LED epi substrate. Operations 915 and 920 implement a wafer-level thin film transfer allowing the LED film stack to be sandwiched between two opposing metal electrodes. At operation 915, any technique known in the art may be utilized to couple the LED film and electrode stack to a carrier. In one embodiment, LED film and electrode stack to a carrier are coupled with any (thermal) compression bonding technique.

Returning to FIG. 11, method 901 continues at operation 925 where a second metal electrode film is deposited over the surface of the LED film stack exposed by operation 920. The composition of the second electrode metal may vary as a function of the LED film stack, for example to provide a desired metal work function suitable for providing an ohmic contact, tunneling contact, etc. In one exemplary embodiment, the metal deposited at operation 925 is an n-type metal suitable for making contact to n-type doped semiconductor layer of an LED film stack. Any known deposition technique, such as but not limited to PVD, CVD, electrolytic, or electroless plating may be utilized at operation 925. As further illustrated in FIG. 12C, n-type metal film 225 is blanket deposited over an n-type doped semiconductor layer of an LED film stack 207.

Figure 12A:
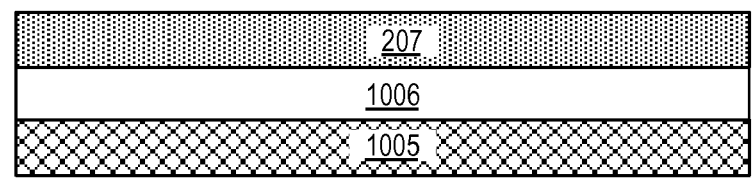
FIGS. 12A, 12B, 12C, 12D, 12E, and 12F are cross-sectional views of exemplary crystalline LED elements as illustrative operations of the method in FIG. 11 are performed, in accordance with embodiments.
Figure 12B:
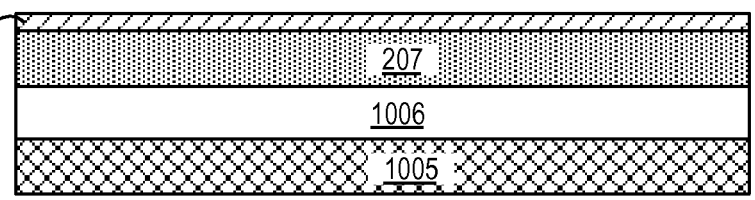
Figure 12C:
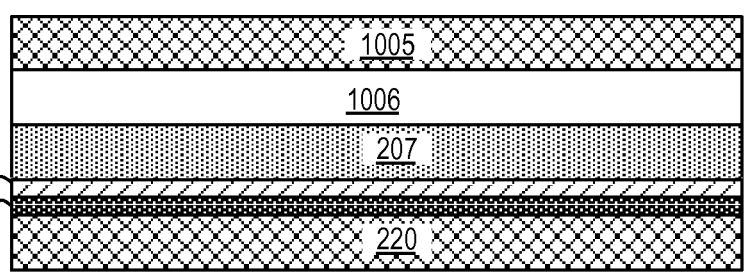
Figure 12C:
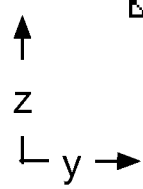
Figure 12D:
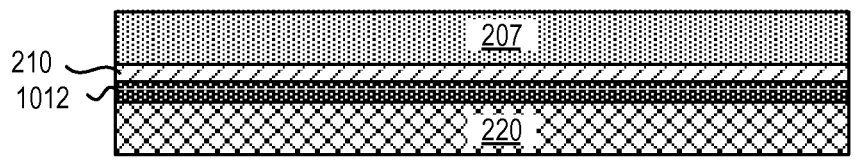

Returning to FIG. 11, method 901 continues at operation 930 where PSA material is deposited over the second metal electrode film. A protective capping material may be further deposited over the PSA material layer. The PSA material may be any of those described above, such as, but not limited to high temperature compatible silicone-based PSA. In the exemplary embodiment a liquid mixture including siloxane polymer (or precursors thereof) is applied over the second metal electrode film using any spin-on process. The PSA mixture is then cured and/or dried to form the PSA material layer. In certain embodiments, the PSA material layer is deposited to a thickness of 1-5 µm. The capping material is optional, but advantageously enables subsequent photolithography and protects the PSA material from erosion during subsequent processing. The capping material may be of any material known in the art to be suitable for the purpose. Any low temperature deposition technique, such as but not limited to PVD and CVD may be utilized to deposit the capping material over the PSA material. FIG. 12D further illustrates a PSA material 1027 blanket deposited over the n-type metal LED electrode film 225, and a carbon doped silicon nitride (CDN) film 1035 blanket deposited over PSA material 1027.

Returning to FIG. 11, method 109 continues at operation 935 where a plurality of LED elements is formed by etching trenches into the LED semiconductor film stack. Any known photolithographic mask patterning and thin film etching process may be utilized at operation 935. The dimensions of the mask features at operation 935 substantially set the dimensions of the LED elements that will be incorporated into a display. The PSA material may be etched with a dry or wet chemical process. A wet chemical etch will produce an isotropic etch profile that reduces the aspect ratio of the trenches between LED elements as a function of the PSA material thickness, which is advantageous where a greater thickness of PSA material (e.g., 2 µm-5 µm) is employed for increased pedestal compliance.

At operation 940, a dielectric sidewall spacer is formed over the LED element sidewalls. Any known dielectric material, such as but not limited to amorphous Si or carbon, SiOx, SiON, SiN, CDO, and CDN may be conformally deposited over the LED elements. An anisotropic etch is then performed using any anisotropic etch process known in the art to be suitable for the chosen dielectric material to form an at least partially self-aligned sidewall coating over the metal and semiconductor sidewalls of each LED element.

Figure 12E:
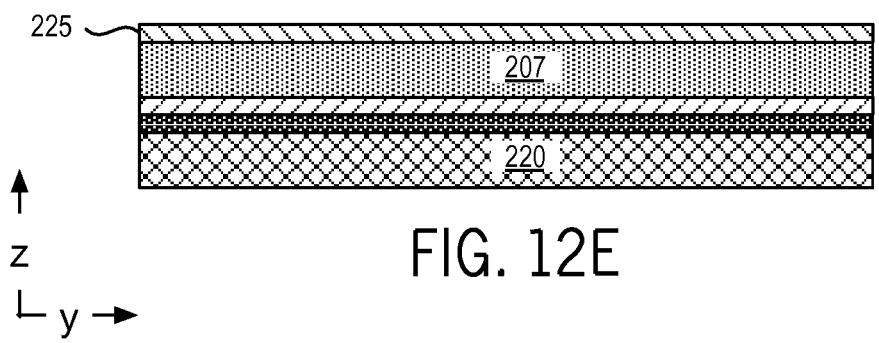
Figure 12F:
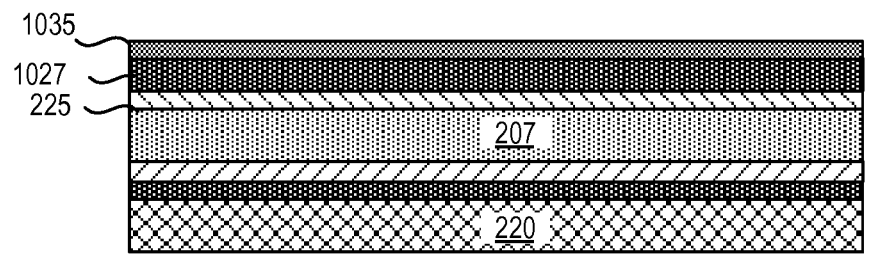

FIG. 12E is a cross-sectional view of crystalline LED elements 230 following their delineation and encapsulation by dielectric spacer. A wet-etched profile 1082 is illustrated in dashed line with the capping layer 1035 removed and spacer 235 covering only the LED element sidewall. In one such embodiment, since a capping layer does not protect PSA 1082, the bonding layer 1012 is advantageously of a different composition than PSA 1082. For example, the bonding layer 1012 can be another PSA of alternate composition that is removable by a solvent having selectivity over PSA 1082. Alternatively bonding layer 1012 may be SiOx, which can be removed with HF. In exemplary embodiments, the lateral element width We of each LED element 230 is patterned to be no more than 5 µm. As further depicted, spacer dielectric 235 (e.g., CDN) serves as a self-aligned sidewall dielectric coating on the LED elements 230. In embodiments including capping layer 1035, LED elements 230 may be encapsulated on five of six sides by one or more dielectric material (e.g., CDN). In advantageous embodiments, the thickness of the dielectric material utilized for spacer formation is selected to ensure dielectric spacer 235 has a lateral thickness, or width Ws that is less than half the nominal lateral width Wt of the trenches 1040 etched into the LED film stack. The limitation on spacer width ensures two dielectric spacers on adjacent LED elements leave a portion of substrate material (e.g., bonding/release material 1012) exposed at the bottom of trench 1040.

Bonding material 1012 may then be removed to release the LED elements except for selected anchor points, or if the bonding material is a PSA material, the LED elements may be removed from the source substrate simply by overcoming the bonding material coupling the elements to the carrier. For example the PSA material coupling the elements to the carrier may be selected to have a lower peel strength and/or lower shear strength relative to the PSA material on a topside of the LED elements at operation 930 (FIG. 11). For example, a low temperature PSA material may be utilized at for bonding material layer 1012 (FIG. 12F), while a high temperature compatible PSA material is utilized for PSA material layer 1027. Upon exposure of PSA material 1027 and contact with a heated assembly head pedestal, a local heating of the contacted LED elements may enable a bond of the PSA material layer 1027 to overcome the bond of bonding material layer 1012. In another embodiment, the bonding layer 1012 may be removed from the perimeter of LED elements 230 to leave only a central contacting area sufficiently small for the LED to be picked up via PSA 1027.

Anchors 245 landing on carrier 220 are then surrounded by a free-space void 249 extending over the entire lateral area or footprint of each LED element 230. In the exemplary embodiments where a photosensitive polymer is employed for the anchor material, each anchor 245 is a polymer pillar contacting the sidewall dielectric (spacer 235) coating at least two adjacent LED elements 230 (e.g., four nearest LED elements 230 are connected by each anchor 245 located at corners of elements 230, or two nearest LED elements are connected if anchors 245 are located at edges instead of the corners). Capping material 1035 is then removed to expose PSA material 1027. Source substrate 1050, illustrated in FIGS. 12G and 12H, is then ready for transfer/bonding to a target substrate in substantially the same manner as described above for source substrate 201A that lacks PSA material 1027. In further embodiments therefore, method 901 may be modified to forgo the application of PSA material 1027 in reliance of the assembly head providing an alternate means (e.g., PSA material) for micro die pick up.

Figure 13:
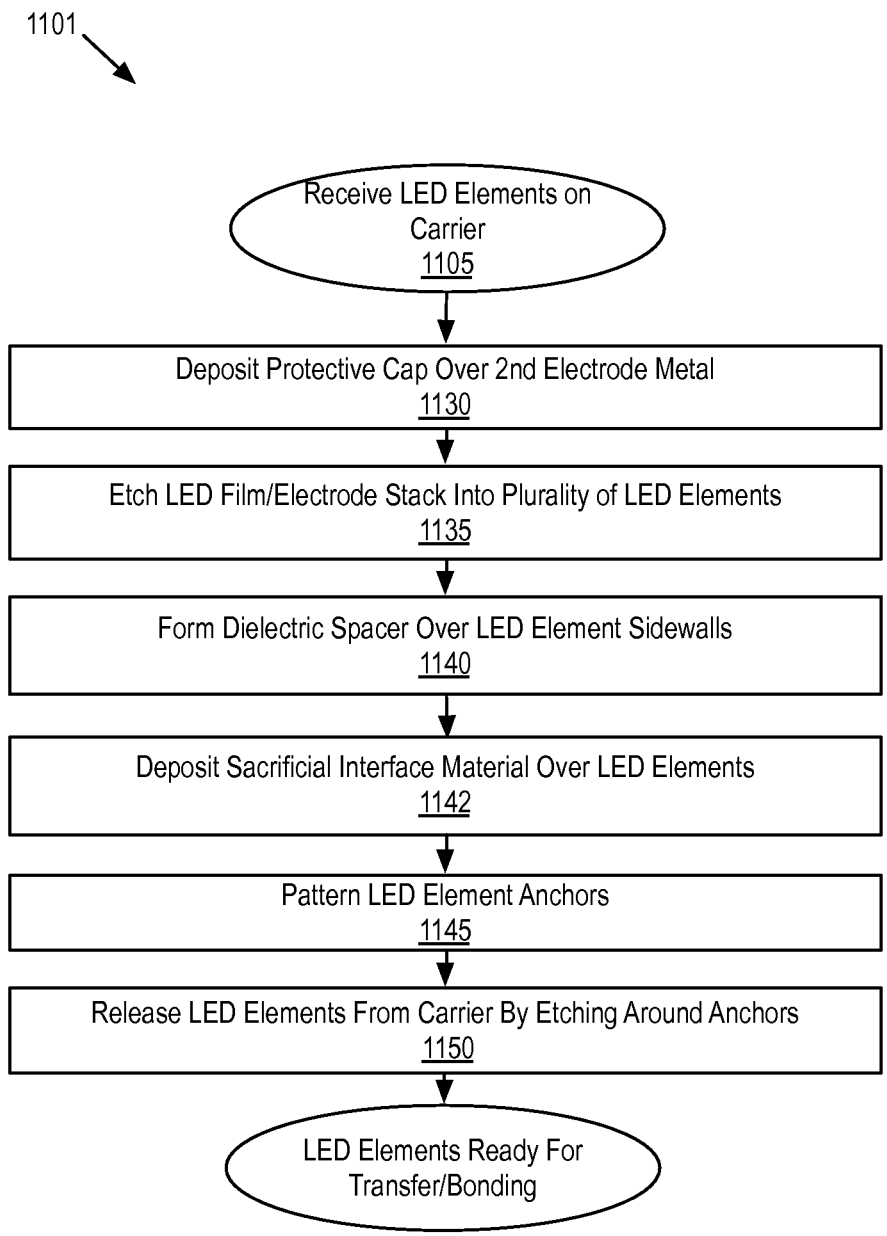
FIG. 13 is a flow illustrating a method of fabricating a µPnB source substrate including crystalline LED elements suitable for assembly into a display, in accordance with alternative embodiments.

FIG. 13 is a flow illustrating a method 1101 for fabricating a µPnB source substrate including crystalline LED elements suitable for assembly into a display, in accordance with alternative embodiments where a sacrificial layer is incorporated into the source substrate to facilitate separating micro die from the assembly head after bonding to a target substrate. Generally, a sacrificial layer may be incorporated into the source substrate in addition to a PSA material or in the alternative to incorporation of a PSA material into the source substrate. FIGS. 12A-12C are cross-sectional views of exemplary crystalline LED elements as illustrative operations of the method 1101 are performed in accordance with one exemplary embodiment.

Figure 14A:
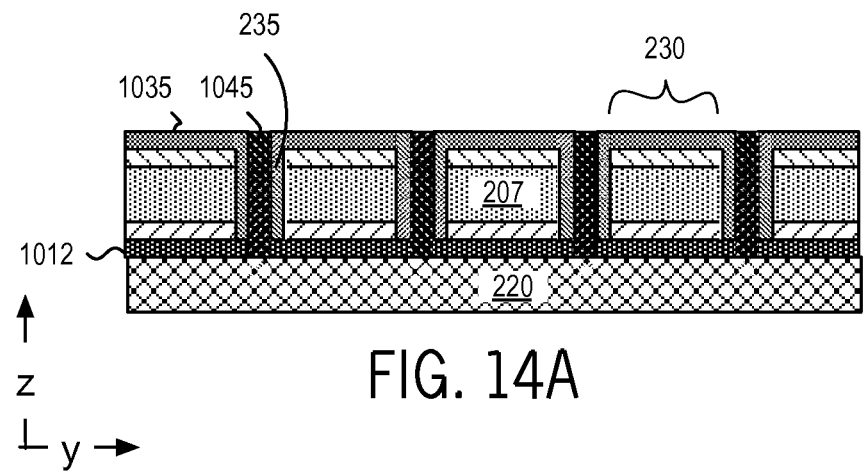
FIGS. 14A, 14B, and 14C are cross-sectional views of exemplary crystalline LED elements as illustrative operations of the method in FIG. 13 are performed, in accordance with alternative embodiments.
Figure 14B:
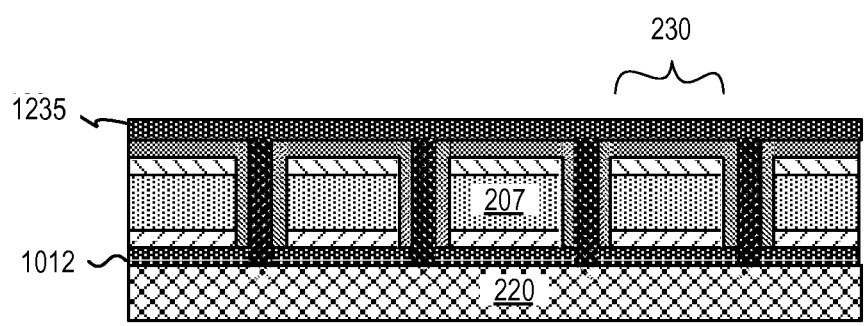
Figure 14C:
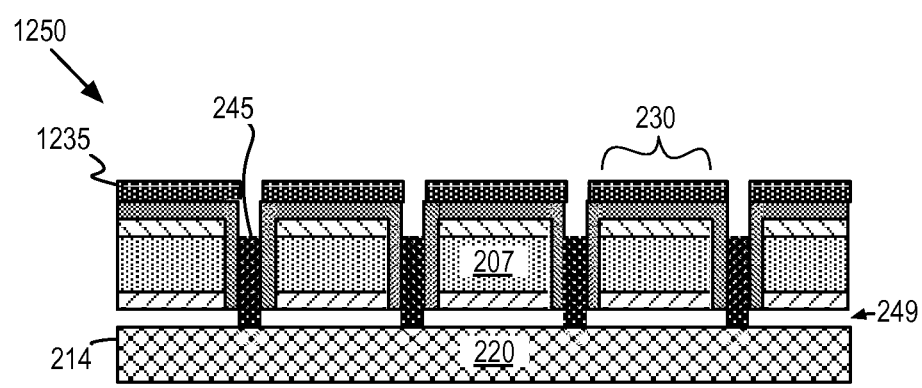

Method 1101 begins with receiving a plurality of monolithically integrated LED elements disposed over a carrier substrate at operation 1105. In the exemplary embodiment, the LED elements have been fabricated on an epitaxial substrate and transferred to the carrier substrate substantially as described above in the context of operations 905-920 (FIG. 11). Method 1101 continues with depositing dielectric capping layer at operation 1130, etching the LED film/electrode stack into a plurality of LED elements at operation 1135, and forming dielectric spacer over the LED element sidewalls at operation 1140, substantially as described above in the context of method 901. In the exemplary embodiment further illustrated in FIG. 14A, anchor material 1045 is planar with dielectric capping material 1035. Method 1101 continues at operation 1142 where a sacrificial interface material is deposited over the LED elements. In exemplary embodiments, the sacrificial interface material is thermally decomposable. The decomposition temperature is advantageously 250° C., or more. In one exemplary embodiment illustrated in FIG. 14B, a sacrificial interface material 1235, such as polycarbonate, is spun over the planarized LED elements, and cured at a relatively low temperature (e.g., below 150° C.). At operation 1145, sacrificial interface material 1235 is lithographically patterned along with the anchor photoresist. As shown in FIG. 14C, once the planarized photoresist is exposed and developed to form anchors, the LED elements are otherwise released from the carrier by removing bonding material 1012 to form void 249 substantially as described above. Dielectric spacer 235, and sacrificial interface material 1235 protects the LED film stack (capping material 1035 may be eliminated). Source substrate 1250 illustrated in FIG. 14C is then ready for pickup/bonding to a target substrate. After a thermal bonding operation (e.g., operation 130 in FIG. 3) with properly selected materials (e.g., InAu), the bond head can be heated up to a higher temperature so that sacrificial interface material 1235 decomposes to release the head assembly from the source die. Capping dielectric 1035 may then be removed after all LED elements are assembled on the target substrate to expose the LED film stack and/or top electrode.

Figure 15:
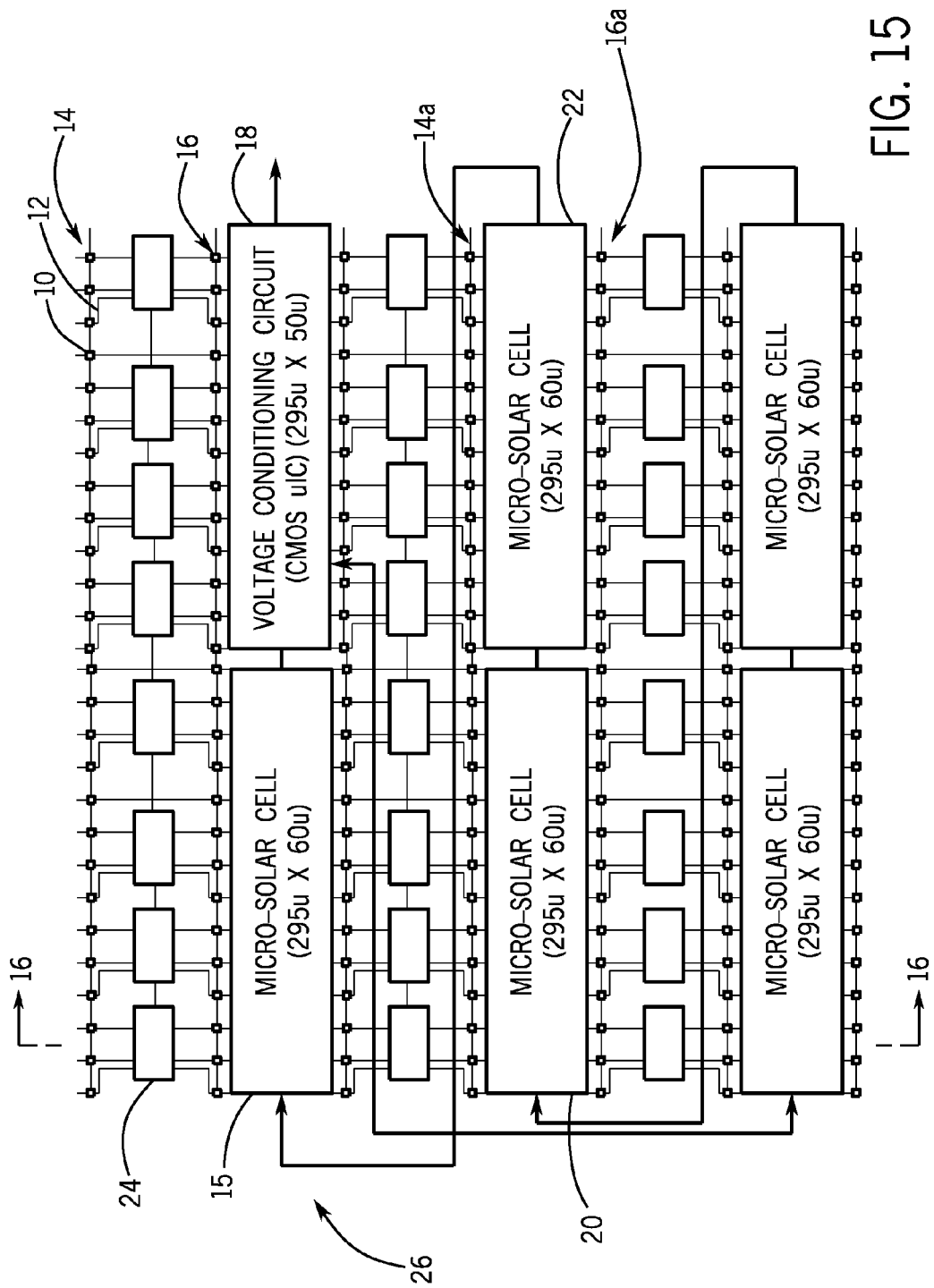
FIG. 15 is a layout for one embodiment.

Referring to FIG. 15, a layout of micro LEDs 10 with interspersed micro solar cells 15 is shown on a common substrate 12. The substrate 12 may be a flex or glass substrate, in one embodiment. The components depicted on said substrate 12 may have been formed on another substrate, cut from that another substrate, and then placed on the substrate 12, for example, using MPB.

The micro LEDs, indicated as 10, are mounted on the same substrate 12 with micro solar cells 14. Thus, there is a row of micro LEDs 14, another row of micro LEDs 16, and then an "empty" row in which the micro solar cell 15 is positioned, together with voltage conditioning circuit 18. This is followed by two more rows 14a and 16a of micro LEDs, followed by still another micro solar cell 20 and a second micro solar cell 22 in between successive rows of micro LEDs 14a and 16a. This pattern continues with only one voltage conditioning circuit needed for a whole array of micro solar cells, in some embodiments. The micro solar cells are connected to one another serially and then connected to the voltage conditioning circuit 18 to output a potential to a charging unit not shown.

Specifically, the micro ICs or integrated circuits 24 between rows 14 and 16 of micro LEDs can easily handle the micro LEDs on two rows, above and below the micro integrated circuits 24. The circuits 24 may correspond to the circuit 212 of the embodiment shown in FIG. 2, while the LEDs 10 correspond to emitters 210 of FIG. 2. Then the solar cells may be daisy chained in series and coupled to the voltage conditioning CMOS micro integrated circuit to convert the voltage to 5 volts, in one embodiment, before passing the voltage to a power source to the charging unit.

Figure 16:
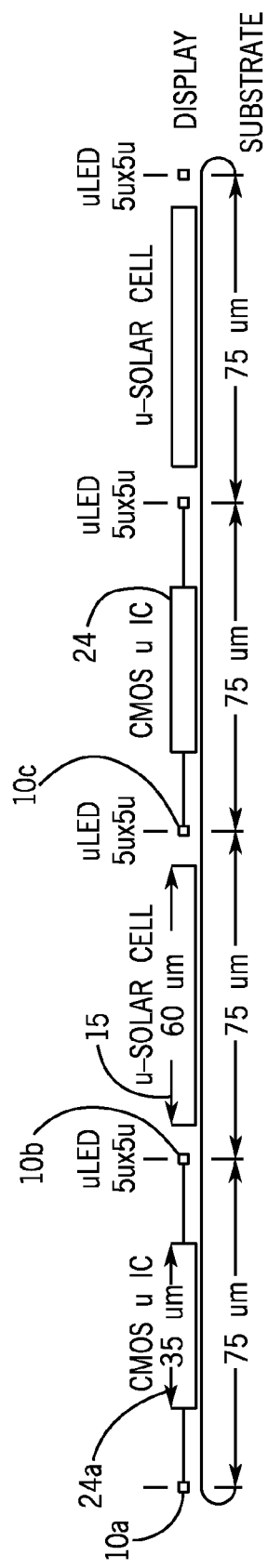
FIG. 16 is a cross-section taken generally along the lines 16-16 in FIG. 15.

Thus, referring to FIG. 16, which is a cross-section taken generally along the line 16-16 in FIG. 15, a micro LED 10a in one row is depicted next to a micro LED 10b in the next row. Between the micro LEDs 10a and 10b is the CMOS micro integrated circuit 24a, which serves two rows, one above and one below, the integrated circuit 24a.

Then between the next micro LEDs 10b and 10c in successive rows, is a micro solar cell 15. As shown in FIGS. 15 and 16, the micro solar cells and conditioning circuits go into the "empty" row direction regions 26 between regions with a pair of rows of micro LEDs and an intermediate row of micro ICs 24.

The micron sized solar cells may be substantially smaller and thinner (on the order of tens, rather than hundreds, of microns for conventional solar cells) than conventional solar cells.

Figure 17:
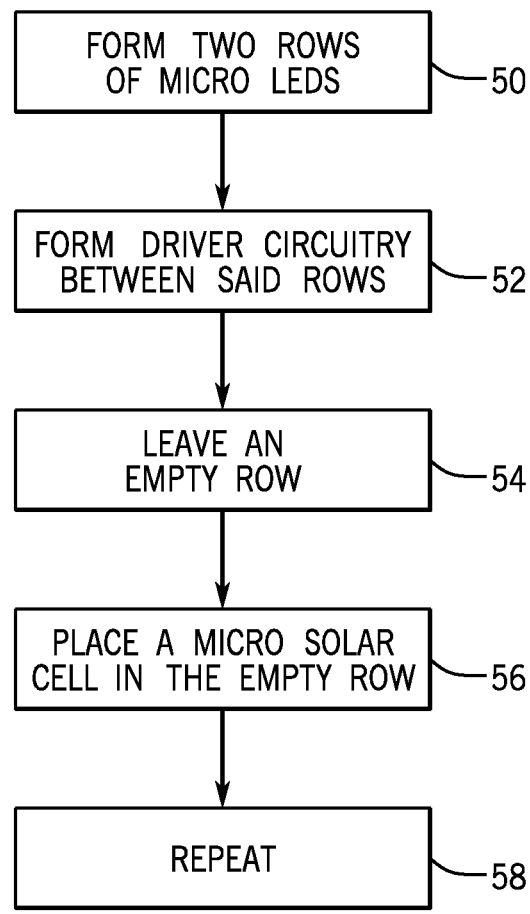
FIG. 17 is a flow chart for one embodiment.

Referring to FIG. 17, a process flow, in accordance with one embodiment, may be implemented in one of a variety of orders. Thus, the order shown in FIG. 15 is not strictly necessary.

The flow begins by forming two rows of micro LEDs, as indicated in block 50. Driver circuitry is formed between the rows, as indication in block 52. An "empty" row may be left after the two rows of micro LED with interstitial driver circuitry, as indicated in block 54. A micro solar cell is placed in the "empty" row, as indicated in block 56. And the flow may be replicated to form any size array, as indicated in block 58.

There is no reason why the solar cells may not be placed first and then the driver circuitry and micro LEDs may be placed. Thus, the order is wholly arbitrary. Therefore, when the words "empty row" are used, it should be understood that they apply to first placing a solar cell in the "empty" row and then placing the micro LEDs. Thus, the concept of an "empty" row simply means that the layout leaves room for a micro solar cell in an area after two successive micro LEDs with interstitial driver circuitry.

As a non-limiting example, the spacing between rows may be 75 μm and the spacing between pixels in a row may be 25 μm. The number of solar cells may be from 15 thousand to 250 thousand. The types of solar cells may be multi-junction, crystalline silicon or thin film copper indium gallium selenide (CIGS) solar cells, as examples. The power produced may be a fraction of 1000 W/m$^2$, which could vary from 0.11 to 0.45, based on PV solar cell efficiency when exposed to bright sunlight. Some embodiments may be used for wearable displays, smartphones and entry tablets, as examples.

The following clauses and/or examples pertain to further embodiments:

One example of an embodiments may be a method comprising placing micro LEDs on a substrate in regularly spaced rows, leaving an empty row between at least two successive rows of micro LEDs, and placing a micro solar cell in said empty row. The method may also include placing two successive rows of micro LEDs, followed by the empty row. The method may also include providing driver circuitry between said successive rows of micro LEDs. The method may also include providing a voltage conditioning circuit in said empty row. The method may also include placing two side by side micro solar cells in said empty row. The method may also include connecting a series of micro solar cells to said voltage conditioning circuit. The method may also include placing said solar cells and said micro LEDs on said substrate using micro place and bond.

Another example embodiment may be an apparatus comprising a substrate, micro LEDs arranged on the substrate in regularly spaced rows, and a micro solar cell between rows of micro LEDs. The apparatus may also include two successive rows of micro LEDs, followed by the row with a micro solar cell. The apparatus may also include driver circuity between said successive rows of micro LEDs. The apparatus may also include a voltage conditioning circuit in a row with a micro solar cell. The apparatus may also include two side by side micro solar cells in between rows of micro LEDs. The apparatus may also include a series of micro solar cells connected to said voltage conditioning circuit. The apparatus may also include said solar cells and said micro LEDs mounted on said substrate using micro place and bond.

Still another example embodiment may be a method comprising placing micro LEDs on a substrate in regularly spaced rows, and placing a micro solar cell in between at least two successive rows of micro LEDs. The method may also include placing two successive rows of micro LEDs, followed by an empty row. The method may also include providing driver circuity between said successive rows of micro LEDs. The method may also include providing a voltage conditioning circuit in said empty row. The method may also include placing two side by side micro solar cells in said empty row. The method may also include connecting a series of micro solar cells to said voltage conditioning circuit. The method may also include placing said solar cells and said micro LEDs on said substrate using micro place and bond.

References throughout this specification to "one embodiment" or "an embodiment" mean that a particular feature, structure, or characteristic described in connection with the embodiment is included in at least one implementation encompassed within the present disclosure. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While a limited number of embodiments have been described, those skilled in the art will appreciate numerous modifications and variations therefrom. It is intended that the appended claims cover all such modifications and variations as fall within the true spirit and scope of this disclosure.

What is claimed is:

1. A method comprising:
   placing micro light emitting diodes on a substrate in regularly spaced rows;
   leaving an empty row between at least two successive rows of micro light emitting diodes; and
   placing a micro solar cell in said empty row.

2. The method of claim 1 including placing two successive rows of micro light emitting diodes, followed by the empty row.

3. The method of claim 2 including providing driver circuity between said successive rows of micro light emitting diodes.

4. The method of claim 1 including providing a voltage conditioning circuit in said empty row.

5. The method of claim 1 including placing two side by side micro solar cells in said empty row.

6. The method of claim 4 including connecting a series of micro solar cells to said voltage conditioning circuit.

7. The method of claim 1 including placing said solar cells and said micro light emitting diodes on said substrate using micro place and bond.

8. An apparatus comprising:
   a substrate;
   micro light emitting diodes arranged on the substrate in regularly spaced rows;
   a micro solar cell between rows of micro light emitting diodes; and
   two successive rows of micro light emitting diodes, followed by the row with a micro solar cell.

9. The apparatus of claim 8 including driver circuity between said successive rows of micro light emitting diodes.

10. The apparatus of claim 8 including a voltage conditioning circuit in a row with a micro solar cell.

11. The apparatus of claim 10, a series of micro solar cells connected to said voltage conditioning circuit.

12. The apparatus of claim 8 including two side by side micro solar cells in between rows of micro light emitting diodes.

13. The apparatus of claim 8 including said solar cells and said micro light emitting diodes mounted on said substrate using micro place and bond.

14. A method comprising:
   placing micro light emitting diodes on a substrate in regularly spaced rows;
   placing a micro solar cell in between at least two successive rows of micro light emitting diodes; and
   placing two successive rows of micro light emitting diodes, followed by an empty row.

15. The method of claim 14 including providing driver circuity between said successive rows of micro light emitting diodes.

16. The method of claim 14 including providing a voltage conditioning circuit in said empty row.

17. The method of claim 16 including connecting a series of micro solar cells to said voltage conditioning circuit.

18. The method of claim 14 including placing two side by side micro solar cells in said empty row.

19. The method of claim 14 including placing said solar cells and said micro light emitting diodes on said substrate using micro place and bond.

* * * * *